(12) United States Patent
Danilov et al.

(10) Patent No.: US 11,354,191 B1
(45) Date of Patent: Jun. 7, 2022

(54) ERASURE CODING IN A LARGE GEOGRAPHICALLY DIVERSE DATA STORAGE SYSTEM

(71) Applicant: EMC IP Holding Company LLC, Hopkinton, MA (US)

(72) Inventors: Mikhail Danilov, Saint Petersburg (RU); Konstantin Buinov, Prague (CZ)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 0 days.

(21) Appl. No.: 17/333,793

(22) Filed: May 28, 2021

(51) Int. Cl.
G06F 11/00 (2006.01)
G06F 11/10 (2006.01)
H03M 13/15 (2006.01)

(52) U.S. Cl.
CPC ....... *G06F 11/1076* (2013.01); *H03M 13/154* (2013.01)

(58) Field of Classification Search
None
See application file for complete search history.

(56) References Cited

U.S. PATENT DOCUMENTS

| | | | |
|---|---|---|---|
| 5,675,802 A | 10/1997 | Allen et al. | |
| 5,805,788 A | 9/1998 | Johnson | |
| 5,950,225 A | 9/1999 | Kleiman | |
| 6,073,218 A | 6/2000 | Dekoning et al. | |
| 6,108,684 A | 8/2000 | Dekoning et al. | |
| 6,233,696 B1 | 5/2001 | Kedem | |
| 6,240,527 B1 | 5/2001 | Schneider et al. | |
| 6,502,243 B1 | 12/2002 | Thomas | |
| 6,549,921 B1 | 4/2003 | Ofek | |

(Continued)

OTHER PUBLICATIONS

D. Sun, G. Zhang and S. Gao, "Data Management across Geographically-Distributed Autonomous Systems: Architecture, Implementation, and Performance Evaluation," in IEEE Transactions on Industrial Informatics, doi: 10.1109/TII.2019.2936298. (Year: 2019).*

(Continued)

*Primary Examiner* — Daniel F. McMahon
(74) *Attorney, Agent, or Firm* — Amin, Turocy & Watson, LLP

(57) ABSTRACT

Selectively distributing fragments of a data protection set in a geographically diverse data storage system is disclosed. The data protection set can comprise fewer fragments than there are zones comprising the geographically diverse data storage system, which can result in some zones not storing a fragment of the data protection set. Control over distribution of fragments of different data protection sets in the geographically diverse data storage system can mitigate or avoid unbalanced storage of the protection sets. The distribution can be controlled in accordance with a protection set distribution scheme (PSDS). A first PSDS can generate coding fragments from randomly select data fragments of all zones. A second PSDS can generate coding fragments from determined unique zone combinations. A third PSDS can generate coding fragments based on affinity values from an affinity matrix. In embodiments, threshold values or rules can be employed to force generation of a protection set regardless of an applied PSDS where the PSDS excessively retards generation of sufficient protections sets.

20 Claims, 10 Drawing Sheets

(56) References Cited

U.S. PATENT DOCUMENTS

| | | | |
|---|---|---|---|
| 7,103,884 B2 | 9/2006 | Fellin et al. | |
| 7,389,393 B1 | 6/2008 | Karr et al. | |
| 7,577,091 B2 | 8/2009 | Antal et al. | |
| 7,631,051 B1 | 12/2009 | Fein et al. | |
| 7,664,839 B1 | 2/2010 | Karr et al. | |
| 7,680,875 B1 | 3/2010 | Shopiro et al. | |
| 7,694,191 B1 | 4/2010 | Bono et al. | |
| 7,721,044 B1 | 5/2010 | Chatterjee et al. | |
| 7,653,792 B2 | 6/2010 | Shimada et al. | |
| 7,752,403 B1 | 7/2010 | Weinman, Jr. | |
| 8,125,406 B1 | 2/2012 | Jensen et al. | |
| 8,261,033 B1 | 9/2012 | Slik et al. | |
| 8,370,542 B2 | 2/2013 | Lu et al. | |
| 8,429,514 B1 | 4/2013 | Goel | |
| 8,479,037 B1 | 7/2013 | Chatterjee et al. | |
| 8,495,465 B1 | 7/2013 | Anholt et al. | |
| 8,504,518 B1 | 8/2013 | Ghemawat et al. | |
| 8,540,625 B2 | 9/2013 | Miyoshi | |
| 8,683,205 B2 | 3/2014 | Resch et al. | |
| 8,725,986 B1 | 5/2014 | Goel | |
| 8,751,599 B2 | 6/2014 | Tran et al. | |
| 8,751,740 B1 | 6/2014 | De Forest et al. | |
| 8,751,897 B2 | 6/2014 | Borthakur et al. | |
| 8,799,746 B2 | 8/2014 | Baker et al. | |
| 8,832,234 B1 | 9/2014 | Brooker et al. | |
| 8,856,619 B1 | 10/2014 | Cypher | |
| 8,856,624 B1 | 10/2014 | Paniconi | |
| 8,972,478 B1 | 3/2015 | Storer et al. | |
| 9,003,086 B1 | 4/2015 | Schuller et al. | |
| 9,021,296 B1 | 4/2015 | Kiselev et al. | |
| 9,037,825 B1 | 5/2015 | Donlan et al. | |
| 9,052,942 B1 | 6/2015 | Barber et al. | |
| 9,063,838 B1 | 6/2015 | Boyle et al. | |
| 9,098,447 B1 | 8/2015 | Donlan et al. | |
| 9,128,910 B1 | 9/2015 | Dayal et al. | |
| 9,208,009 B2 | 12/2015 | Resch et al. | |
| 9,218,135 B2 | 12/2015 | Miller et al. | |
| 9,244,761 B2 | 1/2016 | Yekhanin et al. | |
| 9,268,783 B1 | 2/2016 | Shilane et al. | |
| 9,274,903 B1 | 3/2016 | Garlapati et al. | |
| 9,280,430 B2 | 3/2016 | Sarfare et al. | |
| 9,405,483 B1 | 8/2016 | Wei et al. | |
| 9,411,717 B2 | 8/2016 | Goss et al. | |
| 9,442,802 B2 | 9/2016 | Hung | |
| 9,477,682 B1 | 10/2016 | Bent et al. | |
| 9,495,241 B2 | 11/2016 | Flynn et al. | |
| 9,619,256 B1 | 4/2017 | Natanzon et al. | |
| 9,641,615 B1 | 5/2017 | Robins et al. | |
| 9,665,428 B2 | 5/2017 | Vairavanathan et al. | |
| 9,747,057 B1 | 8/2017 | Ramani et al. | |
| 9,817,713 B2 | 11/2017 | Gupta et al. | |
| 9,864,527 B1 | 1/2018 | Srivastav et al. | |
| 9,942,084 B1 | 4/2018 | Sorenson, III | |
| 9,971,649 B2 | 5/2018 | Dhuse et al. | |
| 10,001,947 B1 | 6/2018 | Chatterjee et al. | |
| 10,007,561 B1 | 6/2018 | Pudipeddi et al. | |
| 10,055,145 B1 | 8/2018 | Danilov et al. | |
| 10,061,668 B1 | 8/2018 | Lazier et al. | |
| 10,089,026 B1 | 10/2018 | Puhov et al. | |
| 10,097,659 B1 | 10/2018 | Rao | |
| 10,108,819 B1 | 10/2018 | Donlan et al. | |
| 10,127,234 B1 | 11/2018 | Krishnan et al. | |
| 10,216,770 B1 | 2/2019 | Kulesza et al. | |
| 10,242,022 B1 | 3/2019 | Jain et al. | |
| 10,282,262 B2 | 5/2019 | Panara et al. | |
| 10,289,488 B1 | 5/2019 | Danilov et al. | |
| 10,331,516 B2 | 6/2019 | Danilov et al. | |
| 10,361,810 B2 | 7/2019 | Myung et al. | |
| 10,387,546 B1 | 8/2019 | Duran et al. | |
| 10,496,330 B1 | 12/2019 | Bemat et al. | |
| 10,503,611 B1 | 12/2019 | Srivastav et al. | |
| 10,567,009 B2 | 2/2020 | Yang et al. | |
| 10,579,490 B2 | 3/2020 | Danilov et al. | |
| 10,613,780 B1 | 4/2020 | Naeni et al. | |
| 10,628,043 B1 | 4/2020 | Chatterjee et al. | |
| 10,644,408 B2 | 5/2020 | Sakai et al. | |
| 10,705,911 B2 | 7/2020 | Vishnumolakala et al. | |
| 10,733,053 B1 | 8/2020 | Miller et al. | |
| 10,740,183 B1 | 8/2020 | Blaum et al. | |
| 10,761,931 B2 * | 9/2020 | Goyal | G06F 11/1076 |
| 10,797,863 B2 | 10/2020 | Chen et al. | |
| 10,846,003 B2 | 11/2020 | Danilov et al. | |
| 10,951,236 B2 * | 3/2021 | Chen | G06F 11/1004 |
| 11,023,331 B2 | 6/2021 | Danilov et al. | |
| 2002/0049883 A1 | 4/2002 | Schneider et al. | |
| 2002/0166026 A1 | 11/2002 | Ulrich et al. | |
| 2002/0191311 A1 | 12/2002 | Ulrich et al. | |
| 2003/0016596 A1 | 1/2003 | Chiquoine et al. | |
| 2005/0071546 A1 | 3/2005 | Delaney et al. | |
| 2005/0080982 A1 | 4/2005 | Vasilevsky et al. | |
| 2005/0088318 A1 | 4/2005 | Liu et al. | |
| 2005/0108775 A1 | 5/2005 | Bachar et al. | |
| 2005/0140529 A1 | 6/2005 | Choi et al. | |
| 2005/0234941 A1 | 10/2005 | Watanabe | |
| 2006/0047896 A1 | 3/2006 | Nguyen et al. | |
| 2006/0075007 A1 | 4/2006 | Anderson et al. | |
| 2006/0143508 A1 | 6/2006 | Mochizuki et al. | |
| 2006/0212744 A1 | 9/2006 | Benner et al. | |
| 2006/0265211 A1 | 11/2006 | Canniff et al. | |
| 2007/0076321 A1 | 4/2007 | Takahashi et al. | |
| 2007/0239759 A1 | 10/2007 | Shen et al. | |
| 2007/0250674 A1 | 10/2007 | Findberg et al. | |
| 2008/0222480 A1 | 9/2008 | Huang et al. | |
| 2008/0222481 A1 | 9/2008 | Huang et al. | |
| 2008/0244353 A1 | 10/2008 | Dholakia et al. | |
| 2008/0320061 A1 | 12/2008 | Aszmann et al. | |
| 2009/0070771 A1 | 3/2009 | Yuyitung et al. | |
| 2009/0113034 A1 | 4/2009 | Krishnappa et al. | |
| 2009/0132543 A1 | 5/2009 | Chatley et al. | |
| 2009/0172464 A1 | 7/2009 | Byrne et al. | |
| 2009/0183056 A1 | 7/2009 | Aston | |
| 2009/0204959 A1 | 8/2009 | Anand et al. | |
| 2009/0240880 A1 | 9/2009 | Kawaguchi | |
| 2009/0259882 A1 | 10/2009 | Shellhamer | |
| 2010/0031060 A1 | 2/2010 | Chew et al. | |
| 2010/0094963 A1 | 4/2010 | Zuckerman et al. | |
| 2010/0174968 A1 | 7/2010 | Charles et al. | |
| 2010/0218037 A1 | 8/2010 | Swartz et al. | |
| 2010/0293348 A1 | 11/2010 | Ye et al. | |
| 2010/0332748 A1 | 12/2010 | Van der Goot et al. | |
| 2011/0029836 A1 | 2/2011 | Dhuse et al. | |
| 2011/0040937 A1 | 2/2011 | Augenstein et al. | |
| 2011/0066882 A1 | 3/2011 | Walls et al. | |
| 2011/0106972 A1 | 5/2011 | Grube et al. | |
| 2011/0107165 A1 | 5/2011 | Resch et al. | |
| 2011/0138148 A1 | 6/2011 | Friedman et al. | |
| 2011/0161712 A1 | 6/2011 | Athalye et al. | |
| 2011/0191536 A1 | 8/2011 | Mizuno et al. | |
| 2011/0196833 A1 | 8/2011 | Drobychev et al. | |
| 2011/0246503 A1 | 10/2011 | Bender et al. | |
| 2011/0292054 A1 | 12/2011 | Boker et al. | |
| 2012/0023291 A1 | 1/2012 | Zeng et al. | |
| 2012/0096214 A1 | 4/2012 | Lu et al. | |
| 2012/0191675 A1 | 7/2012 | Kim et al. | |
| 2012/0191901 A1 | 7/2012 | Norair | |
| 2012/0204077 A1 | 8/2012 | D'Abreu et al. | |
| 2012/0233117 A1 | 9/2012 | Holt et al. | |
| 2012/0311395 A1 | 12/2012 | Leggette et al. | |
| 2012/0317234 A1 | 12/2012 | Bohrer et al. | |
| 2012/0321052 A1 | 12/2012 | Morrill et al. | |
| 2013/0013564 A1 | 1/2013 | Ben-Or et al. | |
| 2013/0047187 A1 | 2/2013 | Frazier et al. | |
| 2013/0054822 A1 | 2/2013 | Mordani et al. | |
| 2013/0067159 A1 | 3/2013 | Mehra | |
| 2013/0067187 A1 | 3/2013 | Moss et al. | |
| 2013/0088501 A1 | 4/2013 | Fell | |
| 2013/0097470 A1 | 4/2013 | Hwang et al. | |
| 2013/0145208 A1 | 6/2013 | Yen et al. | |
| 2013/0238932 A1 | 9/2013 | Resch | |
| 2013/0246876 A1 | 9/2013 | Manssour et al. | |
| 2013/0290482 A1 | 10/2013 | Leggette | |
| 2013/0305365 A1 | 11/2013 | Rubin et al. | |
| 2014/0040417 A1 | 2/2014 | Galdwin et al. | |
| 2014/0064048 A1 | 3/2014 | Cohen et al. | |

(56) References Cited

U.S. PATENT DOCUMENTS

| | | |
|---|---|---|
| 2014/0115182 A1 | 4/2014 | Sabaa et al. |
| 2014/0122745 A1 | 5/2014 | Singh et al. |
| 2014/0149794 A1 | 5/2014 | Shetty et al. |
| 2014/0164430 A1 | 6/2014 | Hadjieleftheriou et al. |
| 2014/0164694 A1 | 6/2014 | Storer |
| 2014/0172930 A1 | 6/2014 | Molaro et al. |
| 2014/0250450 A1 | 9/2014 | Yu et al. |
| 2014/0280375 A1 | 9/2014 | Rawson et al. |
| 2014/0281804 A1 | 9/2014 | Resch |
| 2014/0297955 A1 | 10/2014 | Yamazaki et al. |
| 2014/0304460 A1 | 10/2014 | Carlson, Jr. et al. |
| 2014/0331100 A1 | 11/2014 | Dhuse et al. |
| 2014/0351633 A1 | 11/2014 | Grube et al. |
| 2014/0358972 A1 | 12/2014 | Guarrier et al. |
| 2014/0359244 A1 | 12/2014 | Chambliss et al. |
| 2014/0380088 A1 | 12/2014 | Bennett et al. |
| 2014/0380125 A1 | 12/2014 | Calder et al. |
| 2014/0380126 A1 | 12/2014 | Yekhanin et al. |
| 2015/0006846 A1 | 1/2015 | Youngworth |
| 2015/0074065 A1 | 3/2015 | Christ et al. |
| 2015/0112951 A1 | 4/2015 | Narayanamurthy et al. |
| 2015/0134626 A1 | 5/2015 | Theimer et al. |
| 2015/0142863 A1 | 5/2015 | Yuen et al. |
| 2015/0160872 A1 | 6/2015 | Chen |
| 2015/0178007 A1 | 6/2015 | Moisa et al. |
| 2015/0186043 A1 | 7/2015 | Kesselman et al. |
| 2015/0254150 A1 | 9/2015 | Gordon et al. |
| 2015/0269025 A1 | 9/2015 | Krishnamurthy et al. |
| 2015/0303949 A1 | 10/2015 | Jafarkhani et al. |
| 2015/0331766 A1 | 11/2015 | Sarfare et al. |
| 2015/0370656 A1 | 12/2015 | Tsafrir et al. |
| 2015/0378542 A1 | 12/2015 | Saito et al. |
| 2016/0011935 A1 | 1/2016 | Luby |
| 2016/0011936 A1 | 1/2016 | Luby |
| 2016/0055054 A1 | 2/2016 | Patterson et al. |
| 2016/0085645 A1 | 3/2016 | Buzzard et al. |
| 2016/0162378 A1 | 6/2016 | Garlapati et al. |
| 2016/0169692 A1 | 6/2016 | Gupta |
| 2016/0170668 A1 | 6/2016 | Mehra |
| 2016/0217104 A1 | 7/2016 | Kamble et al. |
| 2016/0232055 A1 | 8/2016 | Vairavanathan et al. |
| 2016/0239384 A1* | 8/2016 | Slik .............. G06F 11/1092 |
| 2016/0253400 A1 | 9/2016 | McAlister et al. |
| 2016/0277497 A1 | 9/2016 | Bannister et al. |
| 2016/0292429 A1 | 9/2016 | Bannister et al. |
| 2016/0294419 A1 | 10/2016 | Sandell et al. |
| 2016/0328295 A1 | 11/2016 | Baptist et al. |
| 2016/0357443 A1 | 12/2016 | Li et al. |
| 2016/0357649 A1 | 12/2016 | Karrotu et al. |
| 2016/0371145 A1 | 12/2016 | Akutsu et al. |
| 2016/0378624 A1 | 12/2016 | Jenkins, Jr. et al. |
| 2016/0380650 A1 | 12/2016 | Calder et al. |
| 2017/0003880 A1 | 1/2017 | Fisher et al. |
| 2017/0004044 A1 | 1/2017 | Tormasov et al. |
| 2017/0010944 A1 | 1/2017 | Saito et al. |
| 2017/0017671 A1 | 1/2017 | Baptist et al. |
| 2017/0031945 A1 | 2/2017 | Sarab et al. |
| 2017/0097875 A1 | 4/2017 | Jess et al. |
| 2017/0102993 A1 | 4/2017 | Hu et al. |
| 2017/0115903 A1 | 4/2017 | Franke et al. |
| 2017/0116088 A1 | 4/2017 | Anami et al. |
| 2017/0123914 A1 | 5/2017 | Li et al. |
| 2017/0153946 A1 | 6/2017 | Baptist et al. |
| 2017/0185331 A1 | 6/2017 | Gao et al. |
| 2017/0187398 A1 | 6/2017 | Trusov |
| 2017/0187766 A1 | 6/2017 | Zheng et al. |
| 2017/0206025 A1 | 7/2017 | Viswanathan |
| 2017/0206135 A1 | 7/2017 | Zeng |
| 2017/0212680 A1 | 7/2017 | Waghulde |
| 2017/0212845 A1 | 7/2017 | Conway |
| 2017/0220662 A1 | 8/2017 | Barton et al. |
| 2017/0235507 A1 | 8/2017 | Sinha et al. |
| 2017/0262187 A1 | 9/2017 | Manzanares et al. |
| 2017/0268900 A1 | 9/2017 | Nicolaas et al. |
| 2017/0272209 A1 | 9/2017 | Yanovsky et al. |
| 2017/0285952 A1 | 10/2017 | Danilov et al. |
| 2017/0286009 A1 | 10/2017 | Danilov et al. |
| 2017/0286436 A1 | 10/2017 | Neporada et al. |
| 2017/0286516 A1 | 10/2017 | Horowitz et al. |
| 2017/0288701 A1 | 10/2017 | Slik et al. |
| 2017/0344285 A1 | 11/2017 | Choi et al. |
| 2018/0052744 A1 | 2/2018 | Chen et al. |
| 2018/0063213 A1 | 3/2018 | Bevilacqua-Linn et al. |
| 2018/0074753 A1 | 3/2018 | Ober |
| 2018/0074881 A1 | 3/2018 | Burden |
| 2018/0088857 A1 | 3/2018 | Gao et al. |
| 2018/0107415 A1 | 4/2018 | Motwani et al. |
| 2018/0121286 A1 | 5/2018 | Sipos |
| 2018/0129417 A1 | 5/2018 | Sivasubramanian et al. |
| 2018/0129600 A1 | 5/2018 | Ishiyama et al. |
| 2018/0181324 A1 | 6/2018 | Danilov et al. |
| 2018/0181475 A1 | 6/2018 | Danilov et al. |
| 2018/0181612 A1 | 6/2018 | Danilov et al. |
| 2018/0217888 A1 | 8/2018 | Colgrove et al. |
| 2018/0246668 A1 | 8/2018 | Sakashita et al. |
| 2018/0267856 A1 | 9/2018 | Hayasaka et al. |
| 2018/0267985 A1 | 9/2018 | Badey et al. |
| 2018/0293017 A1 | 10/2018 | Curley et al. |
| 2018/0306600 A1 | 10/2018 | Nicolaas et al. |
| 2018/0307560 A1 | 10/2018 | Vishnumolakala et al. |
| 2018/0341662 A1 | 11/2018 | He |
| 2018/0375936 A1 | 12/2018 | Chirammal et al. |
| 2019/0028179 A1 | 1/2019 | Kalhan |
| 2019/0034084 A1 | 1/2019 | Nagarajan et al. |
| 2019/0043201 A1 | 2/2019 | Strong et al. |
| 2019/0043351 A1 | 2/2019 | Yang et al. |
| 2019/0050301 A1 | 2/2019 | Juniwal et al. |
| 2019/0065092 A1 | 2/2019 | Shah et al. |
| 2019/0065310 A1 | 2/2019 | Rozas |
| 2019/0102103 A1 | 4/2019 | Ari et al. |
| 2019/0114223 A1 | 4/2019 | Pydipaty et al. |
| 2019/0129644 A1 | 5/2019 | Gao et al. |
| 2019/0188079 A1 | 6/2019 | Kohli |
| 2019/0205437 A1 | 7/2019 | Larson et al. |
| 2019/0215017 A1 | 7/2019 | Danilov et al. |
| 2019/0220207 A1 | 7/2019 | Lingarajappa |
| 2019/0342418 A1 | 11/2019 | Eda et al. |
| 2019/0356416 A1 | 11/2019 | Yanovsky et al. |
| 2019/0384500 A1 | 12/2019 | Danilov et al. |
| 2019/0386683 A1 | 12/2019 | Danilov et al. |
| 2020/0004447 A1* | 1/2020 | Danilov .............. G06F 16/901 |
| 2020/0026810 A1 | 1/2020 | Subramaniam et al. |
| 2020/0034339 A1 | 1/2020 | Gershaneck et al. |
| 2020/0034471 A1 | 1/2020 | Danilov et al. |
| 2020/0042178 A1 | 2/2020 | Danilov et al. |
| 2020/0050510 A1 | 2/2020 | Chien et al. |
| 2020/0104377 A1 | 4/2020 | Earnesty, Jr. et al. |
| 2020/0117547 A1 | 4/2020 | Danilov et al. |
| 2020/0117556 A1 | 4/2020 | Zou et al. |
| 2020/0145511 A1 | 5/2020 | Gray et al. |
| 2020/0151353 A1* | 5/2020 | Struttmann .......... G06F 16/9024 |
| 2020/0204198 A1* | 6/2020 | Danilov .............. G06F 11/1435 |
| 2021/0019067 A1 | 1/2021 | Miller et al. |
| 2021/0019093 A1 | 1/2021 | Karr et al. |
| 2021/0019237 A1 | 1/2021 | Karr et al. |
| 2021/0096754 A1 | 4/2021 | Danilov et al. |
| 2021/0132851 A1* | 5/2021 | Danilov .................. G06F 3/065 |
| 2021/0133049 A1* | 5/2021 | Danilov .............. G06F 11/1469 |
| 2021/0218420 A1* | 7/2021 | Danilov .................. G06F 3/067 |
| 2021/0273660 A1* | 9/2021 | Danilov ............ H03M 13/3761 |

OTHER PUBLICATIONS

Notice of Allowance received for U.S. Appl. No. 16/745,855 dated Sep. 10, 2021, 37 pages.

Non-Final Office Action received for U.S. Appl. No. 16/526,182 dated Nov. 24, 2021, 83 pages.

Notice of Allowance received for U.S. Appl. No. 16/888,144 dated Nov. 22, 2021, 71 pages.

Non-Final Office Action received for U.S. Appl. No. 16/698,096 dated Jan. 5, 2022, 21 pages.

Non-Final Office Action received for U.S. Appl. No. 16/670,715 dated Jan. 5, 2022, 22 pages.

(56) References Cited

OTHER PUBLICATIONS

Non-Final Office Action received for U.S. Appl. No. 16/834,649 dated Jan. 28, 2022, 26 pages.
Office Action dated Apr. 13, 2021 for U.S. Appl. No. 16/781,316, 21 pages.
Office Action dated Feb. 8, 2022 for U.S. Appl. No. 16/986,222, 62 pages.
Office Action dated Nov. 24, 2021 for U.S. Appl. No. 16/538,984, 30 pages.
Non-Final Office Action received for U.S. Appl. No. 16/209,185 dated Jun. 18, 2020, 22 pages.
Martin Hosken, Developing a Hyper-Converged Storage Strategy for VMware vCloud Director with VMware vSAN, Jan. 2018 (Year: 2018).
Non-Final Office Action received for U.S. Appl. No. 16/261,549 dated Apr. 15, 2020, 22 pages.
Non-Final Office Action received for U.S. Appl. No. 16/374,726 dated Jun. 2, 2020, 47 pages.
Natarajan, RAID 0, RAID 1, RAID 5, RAID 10 Explained with Diagrams, Aug. 10, 2010, thegeekstuff.com (18 pages).
Non-Final Office Action received for U.S. Appl. No. 16/177,285 dated Jul. 22, 2020, 31 pages.
Non-Final Office Action received for U.S. Appl. No. 16/261,547 dated Sep. 3, 2020, 26 pages.
Non-Final Office Action received for U.S. Appl. No. 16/261,548 dated Aug. 21, 2020, 42 pages.
Notice of Allowance received for U.S. Appl. No. 16/261,549 dated Jul. 17, 2020, 40 pages.
Qiang et al., "Dynamics Process of Long-running Allocation/Collection in Linear Storage Space", International Conference on Networking, Architecture, and Storage (NAS 2007), Guilin, 2007, pp. 209-216.
Non-Final Office Action received for U.S. Appl. No. 16/374,725 dated Aug. 19, 2020, 50 pages.
Non-Final Office Action received for U.S. Appl. No. 16/511,161 dated Jul. 10, 2020, 24 pages.
Notice of Allowance received for U.S. Appl. No. 15/862,547 dated Mar. 29, 2019 27 pages.
Non-Final Office Action received for U.S. Appl. No. 15/792,714 dated Apr. 4, 2019, 20 pages.
Final Office Action received for U.S. Appl. No. 15/792,714 dated Sep. 12, 2019, 43 pages.
Wikipedia "Garbage Collection", URL: https://en.wikipedia.org/wiki/Garbage_collection_(computer science)#Availability (Year 2017) retrieved using the WayBackMachine, Sep. 8, 2017, 8 pages.
Wikipedia "Erasure code", URL: https://web.archive.org/web/20170908171158/https://en.wikipedia.org/wiki/Erasure_code (Year 2017), retrieved using the WayBackMachine, Sep. 8, 2017, 5 pages.
Wikipedia "Front and back ends" URL: https://en.wikipedia.org/wiki/Front_and_back_ends (Year:2019), Sep. 6, 2019, 4 pages.
Botice of Allowance received for U.S. Appl. No. 15/792,714 dated Nov. 8, 2019, 31 pages.
Non-Final Office Action received for U.S. Appl. No. 15/791,390 dated Sep. 20, 2019, 27 pages.
Final Office Action received for U.S. Appl. No. 15/791,390 dated Feb. 6, 2020, 29 pages.
Non-Final Office Action received for U.S. Appl. No. 15/791,390 dated Apr. 30, 2020, 48 pages.
Huang et al., "Scale-RS: An Efficient Scaling Scheme for RS-Coded Storage Clusters," in IEEE Transactions on Parallel and Distributed Systems, vol. 26, No. 6, pp. 1704-1717, Jun. 1, 2015.
Non-Final Office Action received for U.S. Appl. No. 16/457,615 dated Jul. 20, 2020, 34 pages.
Non-Final Office Action received for U.S. Appl. No. 15/651,504 dated Mar. 21, 2019, 10 pages.
Non-Final Office Action received for U.S. Appl. No. 15/662,273 dated Nov. 16, 2018, 19 pages.
Final Office Action received for U.S. Appl. No. 15/662,273 dated May 15, 2019, 33 pages.
Non-Final Office Action received for U.S. Appl. No. 15/965,479 dated Apr. 15, 2019, 21 pages.
Non-Final Office Action received for U.S. Appl. No. 15/794,950 dated Jul. 9, 2019, 29 pages.
Final Office Action received for U.S. Appl. No. 15/651,504 dated Sep. 18, 2019, 15 pages.
Non-Final Office Action received for U.S. Appl. No. 15/952,179 dated Sep. 10, 2019, 42 pages.
Wikipedia, "Standard Raid Levels—RAID 6", URL: https://en.wikipedia.org/wiki/Standard_RAID_levels#RAID_6, Oct. 18, 2019, 11 pages.
Non-Final Office Action received for U.S. Appl. No. 15/656,382 dated Nov. 1, 2019, 47 pages.
Final Office Action received for U.S. Appl. No. 15/952,179 dated Nov. 26, 2019, 53 pages.
Non Final Office Action received for U.S. Appl. No. 16/024,314 dated Nov. 25, 2019, 42 pages.
Non-Final Office Action received for U.S. Appl. No. 16/177,278 dated Dec. 2, 2019, 55 pages.
Non-Final Office Action received for U.S. Appl. No. 15/651,504 dated Dec. 31, 2019, 18 pages.
Non-Final Office Action received for U.S. Appl. No. 16/010,246 dated Dec. 5, 2019, 67 pages.
Stonebreaker et al. "Distributed RAID—A New Multiple Copy Algorithm ", IEEE ICDE, 1990, pp. 430-437.
Mauralidhar et al. "f4: Facebook's Warm BLOB Storage System", USENIX. OSDI, Oct. 2014, pp. 383-398.
Final Office Action dated Feb. 12, 2020 for U.S. Appl. No. 16/024,314, 29 pages.
Non-Final Office Action received for U.S. Appl. No. 16/010,255 dated Jan. 9, 2020, 31 pages.
Office Action dated Feb. 5, 2020 for U.S. Appl. No. 16/261,551, 30 pages.
Non-Final Office Action received for U.S. Appl. No. 16/228,612 dated Feb. 27, 2020, 49 pages.
Final Office Action received for U.S. Appl. No. 16/010,246 dated Mar. 16, 2020, 33 pages.
Final Office Action received for U.S. Appl. No. 15/656,382 dated Apr. 6, 2020, 31 pages.
Non-Final Office Action received for U.S. Appl. No. 15/582,167 dated Sep. 7, 2018, 19 pages.
Non-Final Office Action received for U.S. Appl. No. 15/952,179 dated Apr. 20, 2020, 68 pages.
Notice of Allowance received for U.S. Appl. No. 16/240,193, dated May 4, 2020, 46 pages.
Final Office Action received for U.S. Appl. No. 16/177,278, dated May 11, 2020, 53 pages.
Non-Final Office Action received for U.S. Appl. No. 16/231,018 dated May 8, 2020, 78 pages.
Notice of Allowance dated May 11, 2020 for U.S. Appl. No. 16/240,193, 24 pages.
Non-Final Office Action received for U.S. Appl. No. 16/228,624 dated Jun. 24, 2020, 65 pages.
Non-Final Office Action received for U.S. Appl. No. 16/240,272 dated Jun. 29, 2020, 64 pages.
Non-Final Office Action received for U.S. Appl. No. 16/228,612 dated Jun. 29, 2020, 62 pages.
Final Office Action received for U.S. Appl. No. 16/010,255 dated Jul. 23, 2020, 36 pages.
Office Action received for U.S. Appl. No. 16/010,246 dated Jul. 27, 2020 36 pages.
Office Action received for U.S. Appl. No. 16/177,278, dated Aug. 21, 2020, 53 pages.
Office Action received for U.S. Appl. No. 16/179,486, dated Aug. 13, 2020, 64 pages.
Guo et al., "GeoScale: Providing Geo-Elasticity in Distributed Clouds" 2016 IEEE International Conference on Cloud Engineering, 4 pages.
Guo et al., "Providing Geo-Elasticity in Geographically Distributed Clouds". ACM Transactions on Internet Technology, vol. 18, No. 3, Article 38. Apr. 2018. 27 pages.
Office Action received for U.S. Appl. No. 16/254,073, dated Aug. 18, 2020, 62 pages.

(56) References Cited

OTHER PUBLICATIONS

Non-Final Office Action received for U.S. Appl. No. 16/526,142 dated Oct. 15, 2020, 21 pages.
Notice of Allowance received U.S. Appl. No. 16/228,612 dated Oct. 20, 2020, 84 pages.
Zhou, et al. "Fast Erasure Coding for Data Storage: A Comprehensive Study of the Acceleration Techniques" Proceedings of the 17th Usenix Conference on File and Storage Technologies (FAST '19), [https://www.usenix.org/conference/fast19/presentation/zhou], Feb. 2019, Boston, MA, USA. 14 pages.
Non-Final Office Action received for U.S. Appl. No. 16/010,255 dated Oct. 29, 2020, 65 pages.
Final Office Action received for U.S. Appl. No. 16/240,272 dated Oct. 27, 2020, 42 pages.
Non-Final Office Action received for U.S. Appl. No. 16/399,902 dated Oct. 28, 2020, 83 pages.
Notice of Allowance received for U.S. Appl. No. 16/374,726 dated Nov. 20, 2020, 78 pages.
Final Office Action received for U.S. Appl. No. 16/228,624 dated Dec. 1, 2020, 63 pages.
Non-Final Office Action received for U.S. Appl. No. 16/570,657 dated Nov. 27, 2020, 75 pages.
Final Office Action received for U.S. Appl. No. 16/177,285 dated Dec. 30, 2020, 61 pages.
Final Office Action received for U.S. Appl. No. 16/511,161 dated Dec. 30, 2020, 61 pages.
Non-Final Office Action received for U.S. Appl. No. 16/399,895 dated Jan. 4, 2021, 64 pages.
Nolice of Allowance received for U.S. Appl. No. 16/374,726 dated Jan. 6, 2021, 56 pages.
Non-Final Office Action received for U.S. Appl. No. 16/399,897 dated Feb. 19, 2021, 56 pages.
Non-Final Office Action received for U.S. Appl. No. 16/670,715 dated Mar. 31, 2021, 60 pages.
Final Office Action received for U.S. Appl. No. 16/177,278 dated Feb. 24, 2021, 109 pages.
Dell, "EMC ECS (Elastic Cloud Storage) Architectural Guide v2.x", URL : https://www.dell.com/community/s/vjauj58549/attachments/vjauj58549/solutions-ch/477/1/h14071-ecs-architectural-guide-wp.pdf, H14071.1, Jun. 2015, pp. 1-21.
Mohan et al., "Geo-aware erasure coding for high-performance erasure-coded storage clusters", Annals of Telecommunications, vol. 73, Springer, Jan. 18, 2018, pp. 139-152.
Final Office Action received for U.S. Appl. No. 16/179,486 dated Jan. 28, 2021, 55 pages.
Non-Final Office Action received for U.S. Appl. No. 16/670,746 dated Feb. 16, 2021, 55 pages.
Jarvis, Zhu, "ECS Overview and Architecture", Dell Technologies, h14071.18, Feb. 2021, pp. 1-55.
EMC; "EMC ECS (Elastic Cloud Storage) Architectural Guide v2.x", URL : https://www.dell.com/community/s/vjauj58549/attachments/vjauj58549/solutions-ch/477/1/h14071-ecs-architectural-guide-wp.pdf,Jun. 2015, 21 pages.
Non-Final Office Action received for U.S. Appl. No. 16/177,285 dated Apr. 9, 2021, 41 pages.
Non-Final Office Action received for U.S. Appl. No. 16/779,208 dated Apr. 20, 2021, 71 pages.
Notice of Allowance received for U.S. Appl. No. 16/726,428 dated Jun. 14, 2021, 34 pages.
Non-Final Office Action received for U.S. Appl. No. 16/698,096 dated May 24, 2021, 62 pages.
Non-Final Office Action received for U.S. Appl. No. 16/745,855 dated May 13, 2021, 71 pages.
Non-Final Office Action received for U.S. Appl. No. 16/834,649 dated Jun. 24, 2021, 61 pages.
Non-Final Office Action received for U.S. Appl. No. 16/179,486 dated May 12, 2021, 50 pages.
Non-Final Office Action received for U.S. Appl. No. 16/570,657 dated May 12, 2021, 79 pages.
Non-Final Office Action received for U.S. Appl. No. 16/670,765 dated Jul. 20, 2021, 79 pages.
Thomasian et al., "Hierarchical RAID: Design, performance, reliability, and recovery", J. Parallel Distrib. Comput. vol. 72 (2012) pp. 1753-1769.
Notice of Allowance received for U.S. Appl. No. 16/570,657 dated Sep. 7, 2021, 65 pages.
Ma et al., "An Ensemble of Replication and Erasure Codes for Cloud File Systems", Proceedings—IEEE Infocom, Apr. 2013, pp. 1276-1284.
Final Office Action received for U.S. Appl. No. 16/698,096 dated Sep. 7, 2021, 24 pages.
Final Office Action received for U.S. Appl. No. 16/177,285 dated Sep. 14, 2021, 65 pages.
Final Office Action received for U.S. Appl. No. 16/670,715 dated Sep. 7, 2021, 35 pages.
Final Office Action received for U.S. Appl. No. 16/179,486 dated Oct. 20, 2021, 46 pages.
Non-Final Office Action received for U.S. Appl. No. 16/584,800 dated Mar. 3, 2022, 90 pages.
Non-Final Office Action received for U.S. Appl. No. 16/403,417 dated Feb. 25, 2022, 100 pages.
Non-Final Office Action received for U.S. Appl. No. 17/153,602 dated Mar. 16, 2022, 40 pages.

* cited by examiner

ERASURE CODING IN A LARGE GEOGRAPHICALLY DIVERSE DATA STORAGE SYSTEM

BACKGROUND

Conventional data storage techniques can employ erasure coding of data to conserve storage space. As an example, a piece of data can be fragmented into data fragments (k) that can be encoded according to an erasure coding scheme to generate one or more coding fragments (m). The information of the piece of data can remain accessible up to the loss of any m of the (k+m) data and coding fragments. As an example, a piece of data can be encoded according to a 4+2 erasure coding scheme that can generate four data fragments and two coding fragments, wherein the information of the piece of data can be accessible up to the loss of any two of the six total fragments. One use of data storage is in bulk data storage.

DETAILED DESCRIPTION

Figure 1:
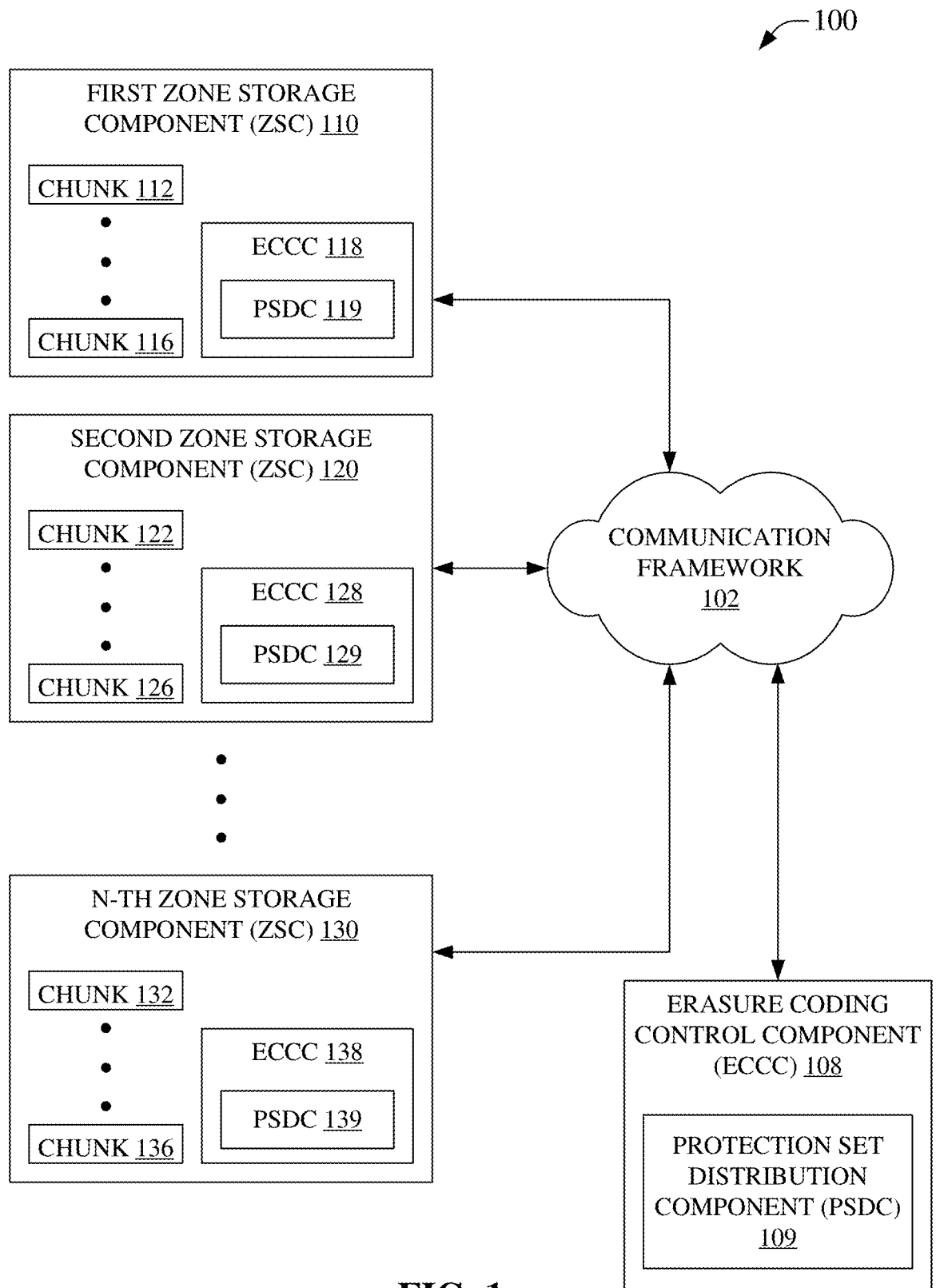
FIG. 1 is an illustration of an example embodiment that can facilitate erasure coding in a large geographically diverse data storage system, in accordance with aspects of the subject disclosure.

The subject disclosure is now described with reference to the drawings, wherein like reference numerals are used to refer to like elements throughout. In the following description, for purposes of explanation, numerous specific details are set forth in order to provide a thorough understanding of the subject disclosure. It may be evident, however, that the subject disclosure may be practiced without these specific details. In other instances, well-known structures and devices are shown in block diagram form in order to facilitate describing the subject disclosure.

As mentioned, data storage techniques can employ erasure coding of data to conserve storage space. One use of data storage is in bulk data storage. Examples of bulk data storage can include networked storage, e.g., cloud storage, etc. Bulk storage can, in an aspect, manage disk capacity via partitioning of disk space into blocks of fixed size, frequently referred to as data chunks, chunks, etc., for example a 128 MB chunk, etc. Chunks can be used to store user data, and the chunks can be shared among the same or different users, for example, one chunk may contain fragments of several user objects. A chunk's content can generally be modified in an append-only mode to prevent overwriting of data already added to the chunk. As such, when a typical chunk is determined to be 'full enough,' it can be sealed so that the data therein is generally not available for further modification, e.g., the chunk can be designated as immutable. These chunks can then be manipulated for storage in a geographically diverse manner to allow for recovery of the data where a first copy of the data is destroyed, e.g., disaster recovery, etc. Chunks from a data storage device, e.g., 'zone storage component' (ZSC), 'zone storage device' (ZSD), etc., located in a first geographic location, hereinafter a 'zone', etc., can be stored in a second zone storage device that is located at a second geographic location different from the first geographic location. Generally, geographic diversity is of a scale so as to provide data protection against regional insults to a geographically diverse data storage system. This can enable recovery of data where a first zone storage device is damaged, destroyed, offline, etc., e.g., disaster recovery of data, by accessing the off-site data from a second zone storage device in a different geographic area.

Geographically diverse data storage can use data compression to store data. As an example, a storage device in Topeka can store a backup of data from a first zone storage device in Houston, e.g., Topeka can be considered geographically diverse from Houston. As a second example, data chunks representing data from Seattle and San Jose can be stored in Denver. The example Denver storage can be compressed or uncompressed, wherein uncompressed can indicate that the Seattle and San Jose chunks are replicated in Denver, and wherein compressed can indicate that the Seattle and San Jose chunks are convolved in Denver, for example via an 'XOR' operation, into a different chunk, e.g., a convolved chunk, that can enable recovery of the Seattle or San Jose data from the convolved chunk, but where the convolved chunk can typically consume less storage space in Denver than the sum of the storage space for both the Seattle and San Jose replica chunks individually in Denver. In an aspect, compression can comprise convolving data and decompression can comprise deconvolving data, hereinafter the terms compress, compression, convolve, convolving, etc., can be employed interchangeably unless explicitly or implicitly contraindicated, and similarly, decompress, decompression, deconvolve, deconvolving, etc., can be used interchangeably unless explicitly or implicitly contraindicated. Compression, therefore, can allow original data to be recovered from a compressed chunk that consumes less storage space than storage of the uncompressed data chunks. This can be beneficial in that data from a location can be backed up by redundant data in another location via a compressed chunk, wherein a redundant data chunk can be smaller than the sum of the data chunks contributing to the compressed chunk. As such, local chunks, e.g., chunks from different zone storage devices, can be compressed via a convolution technique to reduce the amount of storage space used at a geographically distinct location.

In an aspect, the presently disclosed subject matter can include 'zones'. A zone can correspond to a geographic location or region. As such, different zones can be associated with different geographic locations or regions. As an example, Zone A can comprise Seattle, Wash., Zone B can comprise Dallas, Tex., and, Zone C can comprise Boston, Mass. In this example, where a local chunk from Zone A is replicated, e.g., compressed or uncompressed, in Zone C, an earthquake in Seattle can be less likely to damage the replicated data in Boston. Moreover, a local chunk from Dallas can be convolved with the local Seattle chunk, which can result in a compressed/convolved chunk, e.g., a partial or complete chunk, which can be stored in Boston. As such, either the local chunk from Seattle or Dallas can be used to de-convolve the partial/complete chunk stored in Boston to recover the full set of both the Seattle and Dallas local data chunks. The convolved Boston chunk can consume less disk space than the sum of the Seattle and Dallas local chunks. An example technique can be "exclusive or" convolution, hereinafter 'XOR', '⊕', etc., where the data in the Seattle and Dallas local chunks can be convolved by XOR processes to form the Boston chunk, e.g., C=A1⊕B1, where A1 is a replica of the Seattle local chunk, B1 is a replica of the Dallas local chunk, and C is the convolution of A1 and B1. Of further note, the disclosed subject matter can further be employed in more or fewer zones, in zones that are the same or different than other zones, in zones that are more or less geographically diverse, etc. As an example, the disclosed subject matter, in some embodiments, can be applied to data of a single disk, memory, drive, data storage device, etc., without departing from the scope of the disclosure, e.g., the zones in some embodiments can represent different logical areas of the single disk, memory, drive, data storage device, etc. Moreover, it will be noted that convolved chunks can be further convolved with other data, e.g., D=C1⊕E1, etc., where E1 is a replica of, for example, a Miami local chunk, E, C1 is a replica of the Boston partial chunk, C, from the previous example and D is an XOR of C1 and E1 located, for example, in Fargo.

In an aspect, erasure coding can be employed to protect data in a geographically diverse data storage system. In an aspect, erasure coding can protect data in the disclosed chunks, e.g., can protect replica chunks, convolved chunks, other chunks that have already undergone previous erasure encoding, etc. As such, erasure coding can provide data protection in a geographically diverse data storage system, including systems that spread data geographically with, or without, convolution. Generally, erasure coding can divide a portion of data (D) into 'k data fragments.' During an encoding operation, 'm coding fragments' can be generated, wherein the coding fragments can facilitate hardening data against loss, data redundancy, or other such terms. In embodiments of the disclosed subject matter, erasure coding can typically assure that a loss of any m fragments of k+m fragments resulting from encoding of data can be tolerated without loss of access to information comprised in the data. In part, if up to m fragments are lost, or otherwise become less accessible, the less accessible fragments can be restored via a decoding operation. An erasure coding protection scheme can be identified as resulting in t total fragments, where t=k+m, e.g., first k data fragments and first m coding fragments form a first protection set for a first portion of data. It is noted that an erasure coding scheme can equally be regarded as an erasure coding process, erasure coding protocol, etc., e.g., a 4+2 erasure coding process can generate a protection set comprising four data fragments and two coding fragments, etc. Subsequent portions of data can similarly be encoded to form subsequent protection sets. In an embodiment, a data chunk can be treated as a data fragment, for example, in a 4+2 erasure coding (EC) scheme, data D can comprise four chunks whereby a corresponding data protection set can comprise the four chunks plus two additional coding chunks for a total of six chunks. Such embodiments can therefore employ an entire chunk as one of the k data fragments. Accordingly decoding from the protection set can similarly yield entire recovered chunks. Similarly, such a chunk-level protection set can therefore comprise t chunks, where t=k data chunks+m coding chunks. As an example, where a portion of data can be 512 GB, e.g., comprising four 128 GB chunks, then a corresponding 4+2 EC scheme protection set can be 768 GB in size, e.g., four 128 GB data chunks plus two 128 GB coding chunks. Erasure coding can also be performed at more macro levels, for example, by treating 12 chunks as four data fragments of three chunks each, the 12 chunks can be erasure encoded to generate two coding fragments, that can each also be of three chunks in size, e.g., six chunks, such that the 12 data chunks and the six coding chunks can constitute a protection set that can protect access to the data of the 12 chunks with the loss of up to any two of the three coding chunk fragments. As is noted hereinabove, erasure coding can also be performed at more granular levels, e.g., data of less than a single chunk can be erasure coded by fragmenting the chunk into k data fragments and then encoding according to a selected EC scheme to generate the appropriate number of coding fragments.

Use of different tiers of erasure coding can be employed in a geographically diverse data storage system. As an example, erasure coding of data in a chunk can enable protection of the chunk that is convenient to replicating data between zones, e.g., Chunk A→Chunk A', where A' is an encoding of A, can enable access to data represented in Chunk A even where up to m fragments of Chunk A' are less accessible. In this example, encoding a chunk can a facilitate replicating the chunk to a geographically diverse zone by hardening against possible replication errors, e.g., if Chunk A is replicated to another zone as Chunk rA, Chunk rA can have replication defects that can make properly accessing the data represented in Chunk A (as replicated in Chunk rA) less probable, however, where Chunk A is erasure coded, such that Chunk A→Chunk A', and then replicated to the other zone as Chunk rA', where rA' is a replicate of Chunk A' that is an encoding of Chunk A, then access to data represented in Chunk A (and replicated in Chunk rA') can be feasible even with damage of up to m fragments of Chunk rA'. As such, encoding of chunks, e.g., a first-tier of erasure coding, can be favored for replication of data among zones of a geographically diverse data storage system.

In some embodiments, in comparison to simply replicating data between zones for redundancy, erasure coding can be viewed as providing redundancy and also providing greater storage space efficiency. In an example embodiment, a six-zone storage system can store four data fragments in first four zones, then can store two coding fragments in the remaining two zones. This example can provide for a protection set of six total fragments spread across six geographically diverse storage zones in accord with an example 4+2 EC scheme. Accordingly, the information comprised in the four data fragments can remain accessible with the loss of up to any two zones in this example. It can be observed that this results in six total fragments being stored, e.g., four data fragments and two coding fragments. This can be more space efficient than storing a replicate of each of the four data fragments in two separate zones, which can result in storing eight replica data fragments plus the four initial data fragments for a total of 12 data fragments, e.g., 12 data fragments>>six total fragments in the EC protection set.

It can be appreciated that erasure coding of chunks simply to harden the chunks for safer replication typically does not result in conserving storage space. Hardening data via erasure coding generally does not reduce the size of the data itself, e.g., ignoring any replicate data chunk storage mechanisms, and can actually result in a protection set can be slightly larger due to the addition of m coding fragments to the k data fragments to form a protection set of k+m fragments, e.g., t total fragments, and therefore replicating hardened data can consume as much, or more, storage space than equivalent replication without hardening. It is noted hereinabove that encoded data can be convolved to conserve storage space, that data can be convolved to conserve storage space prior to encoding, etc. Moreover, employing erasure coding can enable conservation of storage space for multiply redundant data. In embodiments, use of erasure coding can facilitate storage space conservation, for example employing a EC(4+2) scheme, the four chunks can be doubly replicated and spread, then the spread replicated chunks can be erasure coded in each zone, resulting in two coding chunks that can be further spread among the zones, allowing the replicates to be deleted, leaving the original four chunks and distributed two coding chunks, wherein access to the data of the four chunks can be accessible against the loss of any two zones. In an aspect, erasure coding of data comprising a chunk can be regarded as a first-tier erasure coding and erasure coding of multiple chunks of data can be regarded as a second-tier erasure coding. Multiple tiers of erasure coding and convolution can be beneficial at hardening data, conserving storage space, etc.

In an aspect, erasure coding can be employed at different levels of a geographically diverse storage system, e.g., hierarchical erasure coding, for example, at a chunk-level to erasure encode/decode data of a chunk, e.g., a first-tier erasure coding, at a zone-level to erasure encode/decode multiple chunks, e.g., a second-tier erasure coding, etc. In an aspect, a same or different erasure coding schemes can be used for different tiers, levels, different chunks, etc. As an example, a 4+2 scheme can be employed at the zone-level, while a both a 12+4 scheme and a 10+2 scheme can be used at the chunk-level in a single zone to encode/decode different chunks. Moreover, for example, chunks from zone-level erasure coding can then undergo chunk-level erasure coding, such that the resulting data segments of the chunks of a zone can be said to have been 'doubly erasure encoded.' Accordingly, a chunk of data can be hardened via a first-tier encoding, replicated, and provide protection via a distribution of coding chunks resulting from a second-tier encoding of the chunk with other chunks.

Recovery of less accessible data can be resilient against loss of 1 to m fragments, chunks, etc., of the corresponding erasure coding protection set. Recovery of the inaccessible chunks can be via decoding. The resulting data portion(s) can then be stored as replacements for less accessible chunk(s). It will be noted that where the number of zones in a geographically diverse data storage system is greater or equal to k+m, and where all the data and coding chunks are effectively distributed among the zones, the distributed storage can be resilient to loss of up to m zones, clusters, or chunks because erasure encoding provides a mechanism to recover compromised chunks.

As is noted, an EC scheme can be selected so that the total count of storage system zones matches the total count of chunks/fragments, e.g., t chunks, of generate protection sets. As an example, a 4+2 EC scheme can be employed in a geographically diverse data storage system of six zones. In this example, each zone can store one of the t total fragments of a generated protection set. However, it is further noted that there can be more zones than t chunks/fragments in some embodiments, e.g., a 4+2 EC scheme can be employed in a storage system having, for example, 8, 10, 100, etc., zones. As an aside, some embodiments can have fewer zones than t chunks/fragments, e.g., a 4+2 EC scheme can be employed in a storage system having five zones, although this can result in more than one of the t chunks/fragments being stored on at least one of the zones. This can lead to loss of multiple chunks/fragments of a protection set with the loss of just one zone and, as such, these types of embodiments are less preferable that embodiments having the count of zones equal to, or greater than, the t chunks/fragments of a protection set resulting form a selected EC scheme.

Where the count of zones is equal to the total chunks of a protection set, the protection set can be fully distributed among the zones, e.g., no more than one fragment of a protection set in any one zone of a storage system. Where the count of zones is greater than the total chunks of a protection set, the protection set can again be fully distributed, e.g., again no more than one fragment of a protection set in any one zone of a storage system. However, where the count of zones is greater than the total chunks of a protection set not all zones will store a chunks/fragment of the protection set, e.g., in a nine zone system employing a 4+2 EC scheme, for each protection set stored, there can be three zones that do not store a chunk/fragment of that protection set because the protection set comprises six chunks/fragments and there are nine zones leaving three without a chunk/fragment to store.

It is noted that the EC scheme can be based on, or updated for, a total count of storage system zones. As an example, a six-zone system employing a 4+2 EC scheme can have six additional zones added to the system. In this example, the now 12-zone storage system can continue to employ the 4+2 EC scheme, can update the EC scheme, for example to a 10+2 EC scheme, an 8+4 EC scheme, etc., to match the increased zone count, can update the EC scheme, for example to an 8+2 EC scheme, an 4+4 EC scheme, etc., that does not match the increased zone count, or some combination thereof. In an example, a six-zone system employing a 4+2 EC scheme can be expanded to comprise ten zones. In this example, the 4+2 EC scheme can be updated to an 8+2 EC scheme, for example, which facilitates fully distributed protection sets. It is noted that under the 4+2 EC scheme, recovery of a lost data chunk can rely on decoding via k other chunks of the t total chunks of the corresponding protection set, e.g., data from several other zones will need to be communicated between zones and used to recover a lost data chunk via the decoding of some of the remaining chunks of the protection set. It is further noted that this similarly can occur under the 8+2 EC scheme, with the observation that due to k being larger, more zones will now be involved in the recovery in comparison to the recovery under the 4+2 EC scheme. Typically, involving more zones can have several effects on the storage system. One such effect can be an increase in a probability of a zone becoming less accessible, e.g., a zone going down due to a hardware/software/network failure, etc. This is easily understood in that, for example, if there is a 1% chance of a zone failing, then that probability applies to each zone, and thus, for a 100-zone system, probabilistically, there is a 100% chance of at least one zone failing. As such, more zones can typically correlate with more frequent recovery operations. Another such effect can be that the greater then count of zones, generally the slower a recovery operation can be completed. This effect can be appreciated in that there can be more zones to gather protection set fragments from, and each such zone can be associated with its own access speeds and level of congestion. Moreover, communication protection set fragments between zones can rely on network connections that can typically move data at much slower rates than are observed for an intranet in a data center or other local hardware for a zone, e.g., sending a lot of data over far-flung networks to support a recovery operation can be slower than moving data between fewer zones. Other effects of high total data protection fragmentation, e.g., distributed among many zones of a geographically diverse data storage system can be readily appreciated. As such, it can be desirable to limit protection set fragment counts even where there can be many zones in a storage system. In embodiments of the disclosed subject matter, an EC scheme can be selectable and can support t protection set fragments where t is not equal to the count of zones of a storage system, wherein t is equal to the count of zones of a storage system, or combinations thereof. Further, an EC scheme can be selectively updated, e.g., where a count of zones changes, an EC scheme can be updated from t being equal to the zone count to t not being equal to the zone count. As an example, a six-zone system employing a 4+2 EC scheme can be expanded to an eight-zone system. Correspondingly, the 4+2 EC scheme can be selected to remain unchanged, e.g., t=6 and is now less than the eight zones. Alternatively, the 4+2 EC scheme can be selected to be updated to a 6+2 EC scheme, e.g., t=8 and is again equal to the eight zones. As a further alternative, the 4+2 EC scheme can be selected to be updated, for example, to a 5+2 EC scheme, e.g., t=7 and is now both different than the initial value of six and is also less than the eight zones of the expanded storage system.

In view of the observation that the total fragments of a selected EC scheme stored via a geographically diverse data storage system can be different than a count of zones in said geographically diverse data storage system, there can be different techniques of distributing the stored fragments of a protection set among the zones of the storage system. Where the count of zones is equal to the total number of fragments of a protection set, full distribution of the protection set can result in each zone storing one of the fragments of the protection set. However, where the count of zones is greater than t, distribution of the fragment storage can be less transparent. The instant disclosure illustrates several possible techniques for distributing protection set fragments. In a first disclosed technique, encoding can occur in response to receiving a sufficient number of replicate data fragments from other zones. In a second disclosed technique, the unique combinations of the zones of the storage system can be determined such that encoding a protection set can be performed in each of the unique zone combinations prior to permitting encoding another protection set in a previously used zone combination. In a third disclosed technique, an affinity matrix for zones of a geographically diverse data storage system can be determined and encoding of a protection set can be based on analysis of the affinity matrix, e.g., encoding can be favored where it results in a flatter affinity matrix—a flatter affinity matrix corresponds to less variance between the highest and lowest values of the affinity matrix.

In an embodiment employing the first disclosed technique, for a geographically diverse data storage system with N zones, t protection set chunks/fragments can be fully distributed where N is greater than or equal to t. As an example, let N=10 and t=6, e.g., for a 4+2 EC scheme. In this example, some six zones of the 10 available zones can be used to store the six chunks of the example 4+2 EC scheme protection set, which can result in the remaining four zones not storing any fragments of that protection set. Where encoding can occur in response to sufficient fragments being available for encoding, an example protection set can be generated when four replica data fragments are received. In more detail for this example, zones A to D can each store a data chunk, correspondingly A1 to D1. The zones can replicate A1 to D1 to zone E, which can allow chunk E1, a coding chunk, to be generated in zone E, whereafter the replicas of A1 to D1 can be deleted from zone E. Similarly, replicating chunks A1 to D1 into zone F can enable encoding of coding chunk F1 and subsequent removal of the contributing replica data chunks from zone F. As such, the protection set A1 to F1 protects information comprised in chunks A1 to D1 and the protection set is fully distributed across zones A to F. It is noted however, that where replica data chunks for a second protection set, for example A2–D2, can arrive in zone E, coding chunk E2 can be generated in zone E. This illustrates that zones G, H, I, and J, can go unused with regard to storing of fragments of the second protection set. In this regard, where replica data chunks are more often received at, for example, zone E, this zone can generate more coding chunks than other zones, which can result in an imbalance in the storage system. As such, while the first disclosed technique is operable to allow selection of a count of zones participating in storage of a fully distributed protection set, which can mitigate or limit a probability of a recovery occurring, first disclosed technique can further reduce recovery times in comparison to more broadly distributing protection sets, the first disclosed technique can result in a storage imbalance among zones.

In an embodiment employing the second disclosed technique, for a geographically diverse data storage system with N zones, t protection set chunks/fragments can again be fully distributed where N is greater than or equal to t. For N=10 and t=6, e.g., for a 4+2 EC scheme, some six zones of the 10 available zones can be used to store the six chunks of an example 4+2 EC scheme protection set. In this example, there can be just 70 unique combinations of zones for storing the six chunks of the example protection $$70 = \frac{(N-m)!/k!}{((N-m)-k)!} = (8!/4!)/(8-4)!,$$

where k=4, N=10 and m=2. Generating protection sets in each of the unique zone combinations can then result in a flat distribution of affinity values between the ten example zones, where affinity can be a measure of mutual dependence between zones, e.g., an affinity value can indicate a number of protection sets that comprise data chunks from both a first and a second zone, e.g., an $i^{th}$ and j, zone. As such, where each of the example 70 unique combination of zones stores a protection set, the affinity between any two zones of the 10 zones is the same and all zones can be said to have equal affinity with all other zones. Uneven affinity occurs, for example, where a $5^{th}$ combination of zones stores a fragment from a first protection set and another fragment from a second protection set while a $13^{th}$ combination of zones does not store any protection set fragments. As has been noted, this can lead to imbalances that can compound over time and can be undesirable. Generally, flatter affinities between zones is typically desirable, e.g., it is generally favored to have affinity scores that have less variance between a highest and lowest affinity score for zones of a storage system. It is noted that where N can grow, the number of unique combinations of zones can expand even more rapidly and can become increasingly difficult to manage, e.g., for N=25 and a 4+2 EC scheme, the number of unique combinations can be 8855, and for N=100 there can be an astounding 3,612,280 unique zone combinations to manage. Accordingly, while mathematically accurate, the second disclosed technique can become less practical where larger geographically diverse data storage system setups can comprise many zones, and the number of unique zone combinations can be, from a practical standpoint, unreasonably difficult to manage in view of other techniques, such as the third disclosed technique.

In an embodiment employing the third disclosed technique, for a geographically diverse data storage system with N zones, t protection set chunks/fragments can, as before, be fully distributed where N is greater than or equal to t. Again, for N=10 and t=6, e.g., for a 4+2 EC scheme, some six zones of the 10 available zones can be used to store the six chunks of an example 4+2 EC scheme protection set. In this example, a 10×10 affinity matrix can comprise the affinity values between any two zones of the geographically diverse data storage system. An affinity matrix can be a square matrix that is N×N, where N is the number of zones. A value, $X_{i,j}$, in an affinity matrix can indicate a number of, count of, etc., protection sets that combine data chunks from both an $i^{th}$ zone and a $j^{th}$ zone. Note that (a) $X_{i,i}=0$ and (b) $X_{i,j}=X_{j,i}$. Accordingly, replicating data chunks can be performed in a manner that strives to keep the affinity values, e.g., all values $X_{i,j}|i!=j$, at a similar value, e.g., less variance between the highest and lowest affinity value of the affinity matrix. Accordingly, where data chunks are replicated to balance affinities, then subsequent encoding of the replicated data chunks, e.g., generation of corresponding coding chunks, can support balancing the affinities between zones of the geographically diverse data storage system. This can occur without needing to compute the massive numbers of unique zone combinations that can be observed for the second disclosed technique, e.g., even for N=100, the affinity matrix is just 100×100 in contrast to the 3,612,280 unique zone combinations of the second disclosed technique, but can still provide balance between zones more mechanistically than the first disclosed technique.

Generally, for the several disclosed fragment distribution techniques, it can be noted that there is not a guarantee that all zones will produce data chunks at the same rate. Where some zones may produce more data chunks than others, those data chunks should preferable be encoded at some point, e.g., a selectable threshold, rule, etc., can cause encoding regardless of meeting the criteria of the disclosed protection set fragment distribution techniques. As an example, a threshold, rule, etc., can be specified for a number/count of yet unencoded data chunks that have been replicated from a first zone into a second zone. Where a count of the replicated data chunks that remain unencoded in the second zone of this example exceeds a selectable threshold, encoding can be forced to occur to reduce the count until the remote site below a second threshold, e.g., heuristics can be employed to trigger forced encoding and to suspend forced encoding at different counts of replicated unencoded data chunks in this example. Similarly, in another example, a threshold can relate to an amount of free storage space, used storage space, etc. Where retaining unencoded replicated data chunks occurs to facilitate improved distribution of the fragments of corresponding resultant protections sets, the temporary retention of the replicated data chunks in an unencoded form can consume more storage space than simply immediately encoding. As such the disclosed distribution techniques can require greater storage capacity at the replication destination zones and, when an amount of free capacity is depleted below a threshold level, encoding can be forced to occur. As before, heuristic techniques can be applied to storage space dependent threshold values, rules, etc.

To the accomplishment of the foregoing and related ends, the disclosed subject matter, then, comprises one or more of the features hereinafter more fully described. The following description and the annexed drawings set forth in detail certain illustrative aspects of the subject matter. However, these aspects are indicative of but a few of the various ways in which the principles of the subject matter can be employed. Other aspects, advantages, and novel features of the disclosed subject matter will become apparent from the following detailed description when considered in conjunction with the provided drawings.

FIG. 1 is an illustration of a system 100, which can facilitate erasure coding in a large geographically diverse data storage system, in accordance with aspects of the subject disclosure. System 100 can comprise zone storage components (ZSCs), e.g., first ZSC 110, second ZSC 120, N-th ZSC 130, etc. The ZSCs can communicate with the other ZSCs of system 100, e.g., via communication framework 102, etc. A zone can correspond to a geographic location or region. As such, different zones can be associated with different geographic locations or regions, for example different data centers, different cities, different states, different countries, different hemispheres, etc. A ZSC can comprise one or more data stores in one or more locations. In an aspect, a ZSC can store at least part of a data chunk on at least part of one data storage device, e.g., hard drive, flash memory, optical disk, server storage, etc. Moreover, a ZSC can store at least part of one or more data chunks on one or more data storage devices, e.g., on one or more hard disks, across one or more hard disks, etc. As an example, a ZSC can comprise one or more data storage devices in one or more data storage centers corresponding to a zone, such as a first hard drive in a first location proximate to Miami, a second hard drive also proximate to Miami, a third hard drive proximate to Orlando, etc., where the related portions of the first, second, and third hard drives correspond to, for example, a 'Florida zone', 'Southeastern United States zone', etc. Moreover, in this example, a second ZSC can similarly comprise one or more data storage devices in one or more data storage centers corresponding to a zone, such as a fourth hard drive in a fourth location proximate to Paris, France as part of, for example, a 'European zone', 'French zone', 'central France zone,' 'Paris zone,' etc. A large geographically diverse data storage system can be a geographically diverse data storage system that can comprise more zones than there are total fragments in a stored protection set, e.g., N is typically greater than t in a large geographically diverse data storage system. As an example, a 10-zone geographically diverse data storage system can be considered a large geographically diverse data storage system where data protection sets are, for example, based on a 4+2 EC scheme.

Chunks 112 to 116, 122 to 126, 132 to 136, etc., can comprise a data chunk, a coding chunk, a replica of a data chunk, or other types of chunks. As such, these chunks can facilitate replication of information stored via the chunks in their source zone, in a geographically diverse zone, in their source zone and one or more geographically diverse zones, etc. As an example, a Seattle zone can comprise a first chunk that can be replicated in the Seattle zone to provide data redundancy in the Seattle zone, e.g., the first chunk can have one or more replicated chunks in the Seattle zone, such as on different storage devices corresponding to the Seattle zone, thereby providing intra-zone data redundancy that can protect the data of the first chunk, for example, where a storage device storing the first chunk or a replicate thereof becomes compromised, the other replicates (or the first chunk itself) can remain uncompromised within the zone. In an aspect, data replication in a zone can be via one or more storage devices, e.g., a chunk can be stored on a first data storage device, a second chunk can be stored on a second storage device, and a third chunk can be stored on a third storage device, wherein the first, second, and third storage devices correspond to the first zone, and wherein the first, second, and third storage devices can be the same storage device or different storage devices. Replication of chunks, e.g., the first chunk, as other chunks, e.g., replicating the first chunk as a second chunk, etc., can comprise communicating data, e.g., over a network, bus, etc., e.g., communications framework 102, etc., to other data storage locations, e.g., other storage locations of first, second, third, etc., storage devices and, moreover, can consume data storage resources, e.g., drive space, etc., upon replication.

In an embodiment, system 100 can comprise one or more erasure coding control components (ECCC), e.g., ECCC 108, 118, 128, 138, etc. An ECCC can enable erasure coding of data. In an aspect, an ECCC can facilitate one or more erasure coding schemes. It is noted that the term erasure coding, as used in the instant disclosure, is intended to be inclusive of erasure encoding, erasure decoding, or combinations thereof, unless a more restricted meaning is explicitly or contextually indicated. In an embodiment, an ECCC can interact with the ZSCs of system 100 via communication framework 102 to orchestrate erasure coding scheme(s) for system 100. Further, a first ECCC can orchestrate a first erasure coding scheme between ZSCs of system 100, while another ECCC, e.g., 108, 118, 128, 138, etc., orchestrates a second erasure coding scheme among the ZSCs 110, 120, 130, etc. Other embodiments are readily appreciated and are to be considered within the scope of the present disclosure even where not explicitly recited for the sake of clarity and brevity. An ECCC can enable encoding according to an erasure coding scheme. An ECCC can enable decoding based on an erasure coding scheme.

In an aspect, an ECCC can comprise a protection set (PS) distribution component (PSDC), for example, ECCC 108 can comprise PSDC 109 that can facilitate storing fragments of a protection set according to a distribution technique as is disclosed elsewhere herein. In some embodiments, ECCC 108 and/or PSDC 109 can be accessed by ZSCs 110-130, etc., via communication framework 102, such that each ZSC does not need to comprise a separate ECCC and/or PSDC. In other embodiments, each ZSC can comprise an instance of a an ECCC and/or PSDC, e.g., ZSC 110 can comprise ECCC 118 and PSDC 119, ZSC 120 can comprise ECCC 128 and PSDC 129, etc. in some embodiments, system 100 can comprise both a network accessible ECCC and or PSDC and one or more ECCC/PSDC instances as some or all ZSCs.

In an example embodiment, system 100 can comprise ten zones, e.g., N-th ZSC 130 can be $10^{th}$ ZSC 130. An ECCC of system 100, e.g., ECCC 108, 118, etc., can support erasure coding to generate a data protection set according to a selectable erasure coding (EC) scheme, for example a 4+2 EC scheme. In the example, a PSDC, e.g., PSDC 109, 119, etc., can enable applying a PS fragment distribution technique to facilitate distributing fragments of a protection set among the ZSCs of system 100. A first example distribution techniques, as disclosed herein, can initiate encoding contemporaneously with adequate replicas of data fragments being available, e.g., in this example, when four data fragments are replicated into a remote zone, the PSDC can permit the ZSC to generate a coding fragment. In a second example distribution technique, a PSDC can determine a number of unique ZSC combinations that can store protection sets with t=6 fragments, e.g., 4 data fragments/chunks+2 coding fragments/chunks. In the second example distribution technique the PSDC can permit encoding where the data fragments are replicated into one of the unique combinations of ZSC. Moreover, where a unique combination has been used for encoding, that unique combination can be unavailable for further encoding until all of the other unique combinations of ZSCs have been used for encoding, e.g., this second example distribution technique can force balanced distribution across the unique combination of ZSCs in an iterative manner. In a third example distribution technique, an affinity matrix can be determined and employed in selecting ZSCs for encoding in a manner that favors flattening of the affinity matrix.

Figure 2A:
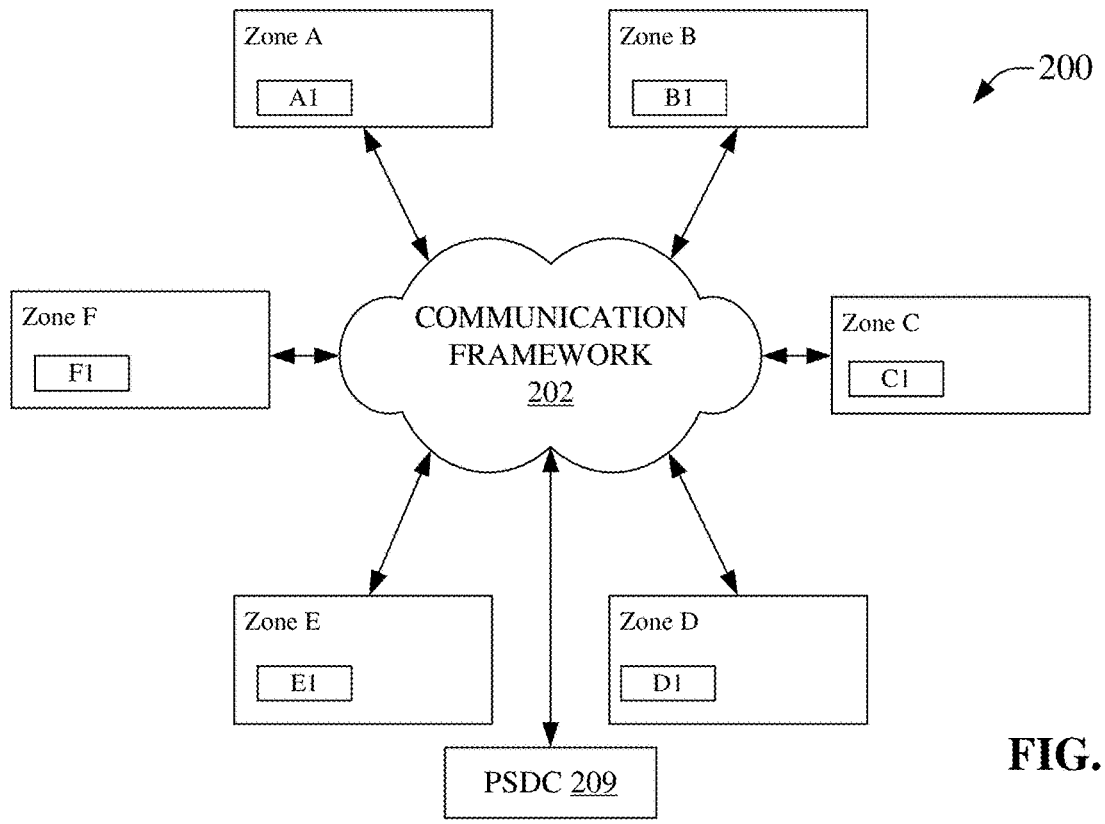
FIG. 2a is an illustration of an example embodiment that can facilitate erasure coding in a large geographically diverse data storage system, in accordance with aspects of the subject disclosure.

FIG. 2a is an illustration of a system 200, which can facilitate erasure coding in a large geographically diverse data storage system, in accordance with aspects of the subject disclosure. System 200 can comprise zones A-F, e.g., six zones. Each of zone A to zone F can store data chunks, e.g., Zone A can store chunk A1, etc. Moreover, each of zone A to zone F can store other chunks, for example, replicates of chunks from other zones, coding chunks, etc. As an example, chunk E1 can be a coding chunk based on data chunks A1 to D1. Similarly, chunk F1 can be a second coding chunk also based on data chunks A1 to D1. Accordingly, in this example, chunks A1 to F1 can be a protection set based on a 4+2 EC scheme. Moreover, the example protection set can be considered fully distributed where each chunk is stored on a distinct zone of system 200. The several zones of system 200 can communicate via communication framework 202. Moreover, communication framework 202 can enable communication with PSDC 209 that can enable distribution of the chunks of the protection set among the zones comprising system 200. As an example, where system 200 comprises ten zones including the six illustrated zones A to F, PSDC 209 can enable determining which zones will store coding chunks. PSDC 209 can support distribution of the chunks comprising a protection set according to a protection set distribution technique, such as any of the protection set distribution techniques disclosed elsewhere herein.

Figure 2B:
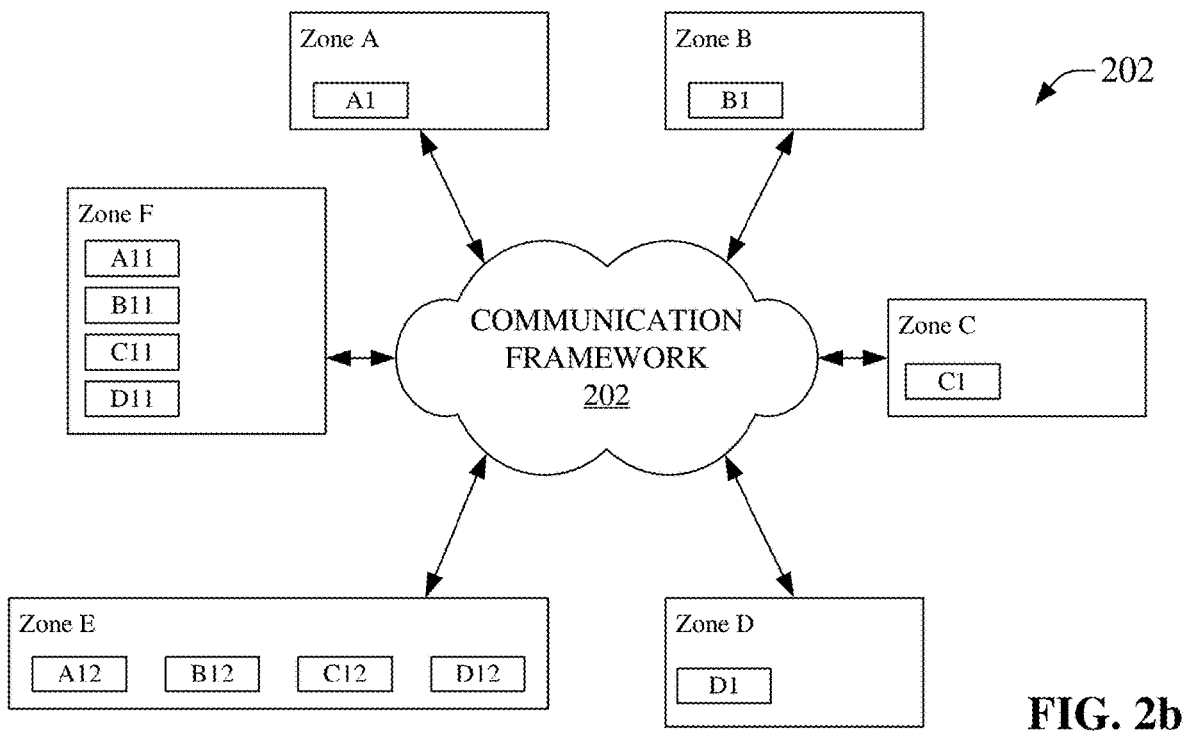
FIG. 2b is an illustration of an example embodiment that can facilitate data replication supporting erasure coding in a large geographically diverse data storage system, in accordance with aspects of the subject disclosure.

FIG. 2b is an illustration of a system 202, that can be the same as, or similar to, system 200 and system 202 can facilitate erasure coding in a large geographically diverse data storage system, in accordance with aspects of the subject disclosure. System 202 can again comprise zones A-F, e.g., six zones that can store chunks. System 202 can illustrate replicating data chunks from zones A to D in each of zone E and zone F, e.g., chunk A11 can be a first replica of chunk A1, chunk A12 can be a second replica of chunk A1, etc. When compared to system 200, it can be observed that storage of unencoded data chunk replicas can consume substantially more space than storing corresponding code chunks, e.g., zone F of system 200 stores only one coding chunk in contrast to zone F of system 202 storing four data chunk replicas. Accordingly, replication of data chunks into a zone without encoding can be less desirable from a standpoint of consuming much more storage space. In system 202, for example where replicas A11, B11, and C11 have been replicated into zone F, there can be insufficient replicas to perform encoding according to an example 4+2 EC scheme. Accordingly, zone F can retain the unencoded chunks until D11 arrives in zone F. At this point, encoding can occur and a coding chunk, e.g., chunk F1 of system 200, can be generated. This causes chunks A11 to D11 to be redundant. They can be accordingly deleted from zone F, e.g., made available for overwriting, erased, etc. This prompt encoding upon the arrival of chunk D11 can be an embodiment of the first disclosed distribution technique, e.g., encoding in response to sufficient data chunk/fragment replicas being available at a zone.

System 202 can further illustrate the second disclosed distribution technique in that for N=6, k=4, and m=2, there is only one unique zone combination. Accordingly, the second disclosed distribution technique can have the same results as the first disclosed distribution technique in this example. However, where N=10, then there can be 70 unique zone combinations. In this example, an encoding in zone F for a second protection set can be refused until each of the other 69 remaining unique combinations of zones has performed an encoding of a protection set. The second disclosed distribution technique thereby can permit each unique zone combination to have a complete a round of encoding before being permitted to encode a second round, for example, zone F can be permitted to encode in a first round but is then removed from consideration for further encoding until all other unique zone combinations have performed an encoding in the first round.

Additionally, system 202 can illustrate the third disclosed distribution technique. A 6×6 affinity matrix can be determined to indicate an affinity value between any two zones. In an example, zone F can store unencoded chunks A11 to D11 until it can be determined that the affinity value of zone F exceeds an affinity threshold value, e.g., the affinities of zone F in relation to each of zones A to D can be determined to be made closer to an average affinity value of the affinity matrix by allowing the encoding to occur. As such, where encoding A11 to D11 into F1 will flatten the affinity matrix, e.g., reducing the variance between the maximum and minimum affinity values of the affinity matrix, then the encoding can be permitted under the third disclosed distribution technique. It is noted that flattening the affinity matrix is desirable, however, this can be also viewed as minimizing perturbation of the affinity matrix, e.g., allowing encoding where it will decrease the flatness of the matrix the least. This is because in some circumstances, the variance of affinities in the matrix will become greater in response to an encoding operation, however, the increase in the variance can be determined to be less than other encodings, e.g., the permitted encoding can be the least perturbing to the affinity matrix without departing from the scope of the instant disclosure. As an example, in system 202, the affinity matrix can be populated with all zero values because there can be no protection sets stored at a first time. An all zero affinity matrix is perfectly flat. As such, any encoding will result in increasing the entropy of the affinity matrix, e.g., encoding F1 can, for example, cause the values at A-F, B-F, C-F, and D-F of the matrix (and similarly F-A, F-B, F-C, F-D, etc.) to increase to one while the values at A-E, B-E, C-E, D-E, etc. remain at zero. This example clearly decreases the flatness of the affinity matrix but encoding is nonetheless permitted because no other encoding is better. However, where other data chunk replicas are subsequently stored at zone F, encoding of A12 to D12 into E1 at zone E can be permitted prior to permitting encoding of the additional chunks at zone F because the encoding at zone E would flatten the affinity matrix, e.g., all zones would then have an affinity value of one, rather than increasing the affinities of protection sets sharing zone F with a further encoding, e.g., zone F going to an affinity of two and zone E remaining at an affinity of zero.

Figure 3:
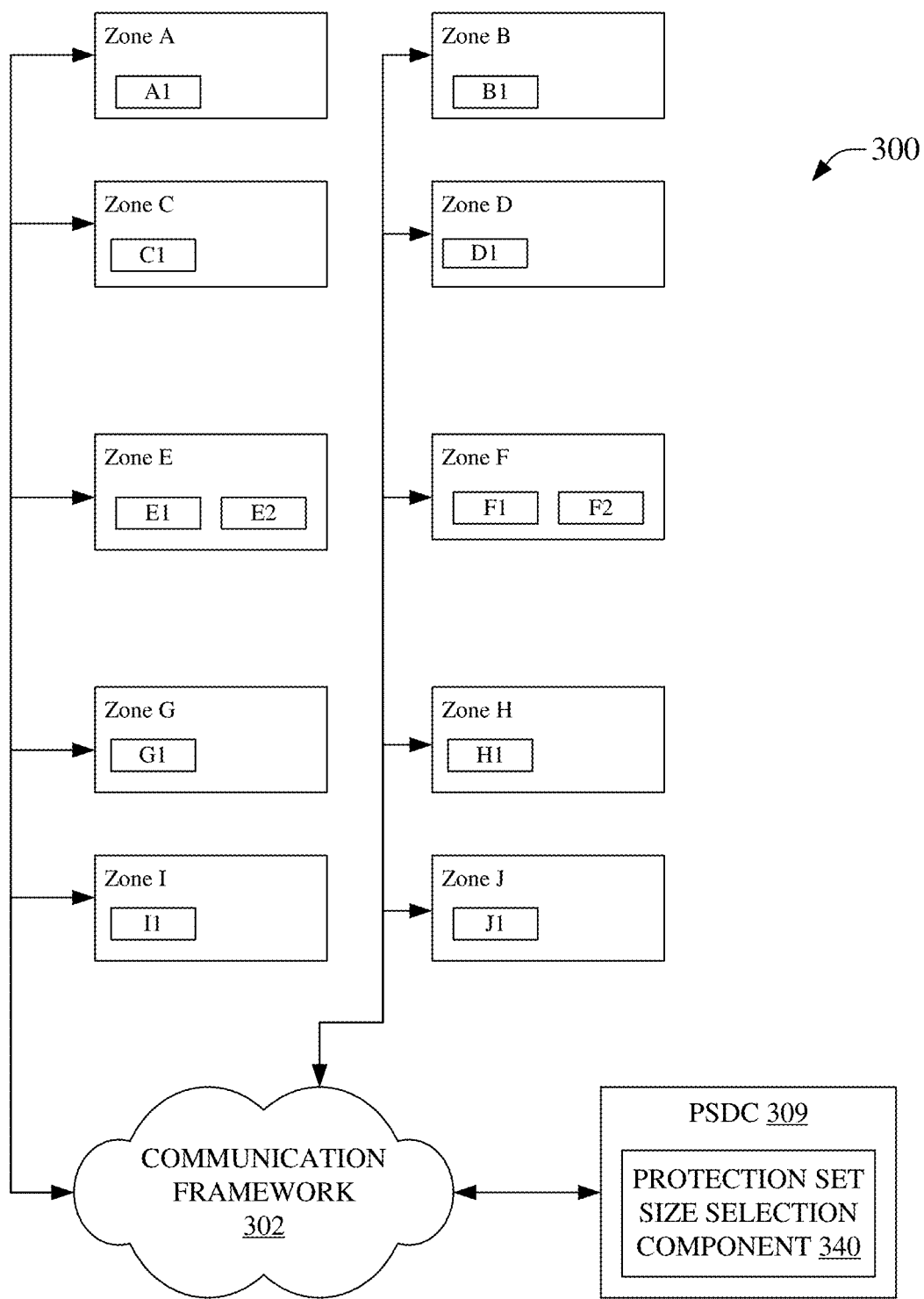
FIG. 3 is an illustration of an example embodiment that can facilitate erasure coding to fewer zones than comprise a geographically diverse data storage system, in accordance with aspects of the subject disclosure.

FIG. 3 is illustration of a system 300, which can facilitate erasure coding to fewer zones than comprise a geographically diverse data storage system, in accordance with aspects of the subject disclosure. System 300 can comprise a plurality of zones forming a geographically diverse data storage system, for example, system 300 can comprise ten zones, e.g., zones A to J. The zones, e.g., ZSCs, can store data in the form of chunks, e.g., data chunks, coding chunks, replica chunks, etc., e.g., chunks A1 to J1, E2, F2, etc. The zones can communicate via communication framework 302. A geographically diverse data storage system comprised in system 300 can communicate with PSDC 309, which can enable distribution of fragments of protection sets generated according to a selectable erasure coding scheme. The distribution of fragments/chunks comprising a protection set can support use of erasure coding to reduce consumed storage space while also mitigating a probability of a protection set undergoing a recovery operation via supporting protection sets having total count of fragments/chunks, t, that can be less than a count of zones comprised in the geographically diverse data storage system, N, e.g., a ten-zone geographically diverse data storage system (N=10) employing a 4+2 EC scheme (t=6), etc. Moreover, where a recovery operation does occur in this type of system, the complexity of the recovery operation can be substantially less than can otherwise be encountered, for example, where N=t. It is noted that where less than all zones of a geographically diverse data storage system store a fragment of a protection set, selection of which zones store the fragments can be of some importance to reduce a possibility of the geographically diverse data storage system becoming substantially imbalanced in regard to where data is stored.

Zones can have non-uniform affinity in the absence of controlling techniques. As an example, zones in the Americas can store data at very different times from zones in Asia, which can lead to high affinity between Western zones, high affinity between eastern zones, and low affinity between eastern and western zones. However, directing erasure coding to encode western data in Asia, and correspondingly directing erasure coding of Asian data in the Americas, the affinity values across the example global geographically diverse data storage system can be flattened. Moreover, this flattening can occur while still limiting the total number of protection set fragments to less than the total number of zones in the example geographically diverse data storage system. As such, this can mitigate the probability of a data access issue, e.g., the probability of a data access issue can be the sum of the individual probabilities for each zone and by reducing the number of zones involved, the probability can correspondingly be reduced. Moreover, there can still be geographically diverse data protection according to a selected EC scheme, e.g., protection set size selection component 340 can facilitate selection of a protection set size, for example, t=6 corresponding to a 4+2 EC scheme, etc. Further, where a recovery operation is needed, the number of zones and amount of data to be communicated can be reduced in comparison to distributing fragments of a protection set across all zones of a geographically diverse data storage system.

In a first disclosed distribution technique, a zone that will store a coding chunk can be directed to wait until sufficient data chunk replicas have been received from selected other zones. This can be an inexpensive solution that can be rapidly implemented. In an example, zones A-D can be American zones, zones E and F can be European zones, and zones G-J can be Asian zones. In this example, zones A-D can be expected to generate more data chunks during their standard working hours than the Asia zones due to the time difference. Accordingly, in an uncontrolled system, Zone E can encode coding chunks primarily for American data during the American working hours and comparatively few Asian coding chunks. In accord with this first distribution technique, PSDC 309 can instruct Zone E to generate coding chunks based on both American and Asian data chunk replicas and to store excess American data chunk replicates in an unencoded format until sufficient Asian data chunk replicas are available. This example can act to buffer American data during the American workday, then generate many protection sets as the Asian work day occurs, e.g., providing the selected mix of American and Asian data for encoding. This typically can improve the balance of storage, e.g., if a recovery operation is needed, the recovery can be based on both American and Asian data chunks and a European coding chunk. This can be contrasted to the uncontrolled condition in which a recovery operation for American data would typically not involve Asian data, where recovery of Asian data would typically not involve American data, etc. However, this fist distribution technique can be adapted to be more mathematically complete, e.g., to mathematically ensure that protection sets are distributed evenly among the zones, as is disclosed elsewhere herein.

It is further noted that the first disclosed distribution technique can benefit from some safeguards. Firstly, it is noted that not all zones will produce data chunks at the same rate, in the same number, etc. As such, directing a zone to wait until a designated mix of zones have contributed a replica of a data chunk can result in amassing many unencoded chunks, for example, where in the above example Asia generates twice the number of data chunks as the Americas, there can be too few American data chunks to consume all the Asian data chunks into protection sets. According to the simple wait until you have both American and Asian chunks to encode distribution technique can therefore result in storing many unencoded Asian chunks in this example. This can be highly undesirable due to the lower storage space efficiency of replicas in comparison to protection sets mention at various other places herein. In an embodiment, a threshold value, or rule, can be specified, for example, for a number of unencoded data chunks that were replicated from a zone or group of zones, for a count of unencoded chunks being stored at a zone, etc. If the threshold value is traversed, data chunks can be encoded despite not otherwise being in accord with the first distribution technique. In the preceding example, the excess Asian chunks can then be encoded despite not having enough American data chunks present. Heuristics can be employed to reduce the backlog to another threshold level. Moreover, the storage of unencoded chunks until a condition is met to permit encoding can require greater storage capacity at a replication zone because data chunk replicas can remain unencoded for a longer time. This can be addressed via another threshold/rule that can force encoding based on an amount of free storage space remaining, an amount of used storage space, etc., e.g., where 10% of total zone capacity remains, begin encoding unencoded data chunk replicas.

Figure 4:
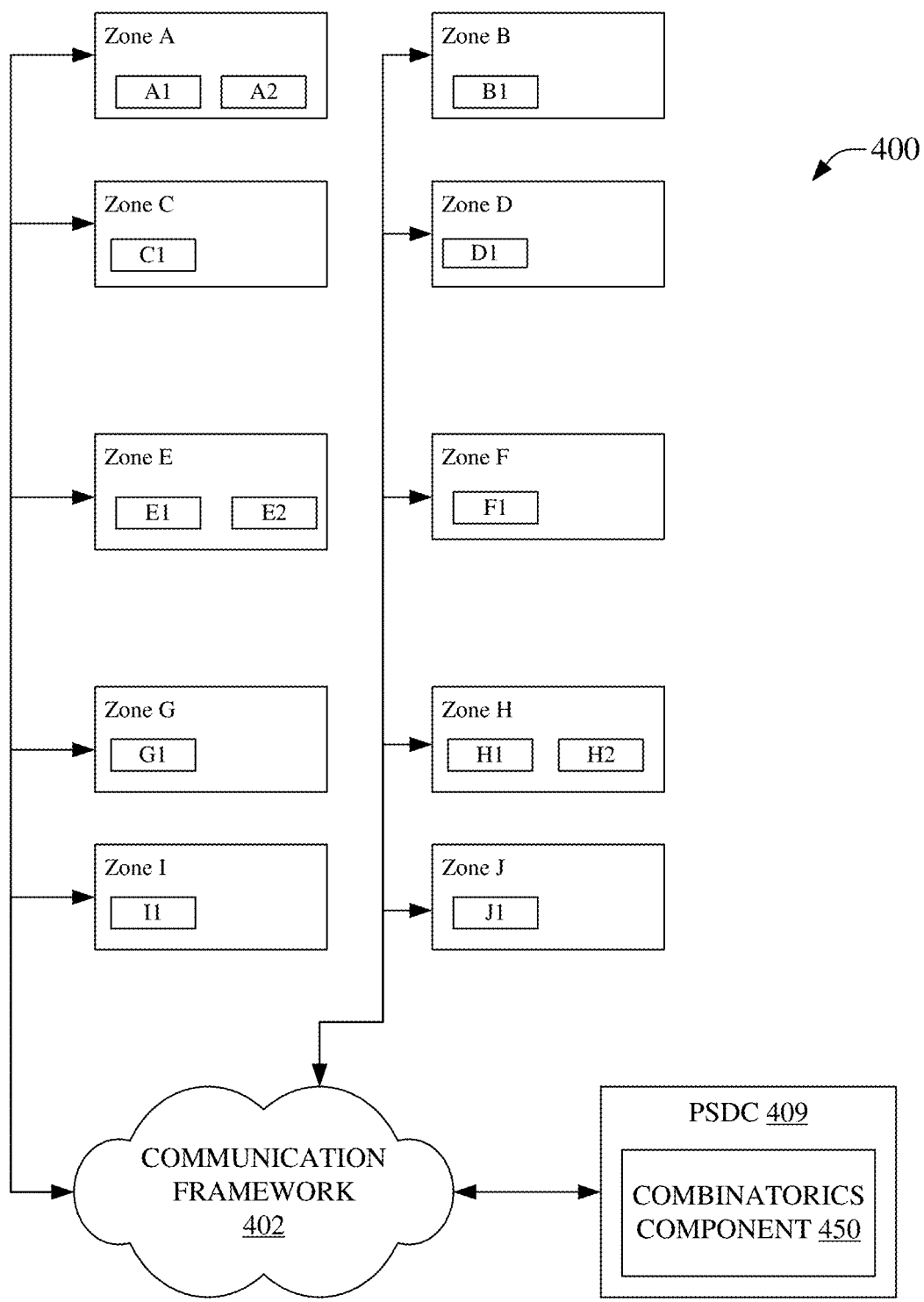
FIG. 4 illustrates an example embodiment that can facilitate erasure coding in a geographically diverse data storage system based on a determination of unique zone combinations, in accordance with aspects of the subject disclosure.

FIG. 4 is illustration of a system 400, which can facilitate erasure coding in a geographically diverse data storage system based on a determination of unique zone combinations, in accordance with aspects of the subject disclosure. System 400 can comprise a plurality of zones forming a geographically diverse data storage system, for example, system 400 can comprise ten zones, e.g., zones A to J. The zones, e.g., ZSCs, can store data in the form of chunks, e.g., data chunks, coding chunks, replica chunks, etc., e.g., chunks A1 to J1, A2, E2, H2, etc. The zones can communicate via communication framework 402. A geographically diverse data storage system comprised in system 400 can communicate with PSDC 409, which can enable distribution of fragments of protection sets generated according to a selectable erasure coding scheme. The distribution of fragments/chunks comprising a protection set can support use of erasure coding to reduce consumed storage space while also mitigating a probability of a protection set undergoing a recovery operation via supporting protection sets having total count of fragments/chunks, t, that can be less than a count of zones comprised in the geographically diverse data storage system, N, e.g., a ten-zone geographically diverse data storage system (N=10) employing a 4+2 EC scheme (t=6), etc. Moreover, where a recovery operation does occur in this type of system, the complexity of the recovery operation can be substantially less than can otherwise be encountered, for example, where N=t. It is noted that where less than all zones of a geographically diverse data storage system store a fragment of a protection set, selection of which zones store the fragments can be of some importance to reduce a possibility of the geographically diverse data storage system becoming substantially imbalanced in regard to where data is stored.

As previously noted, zones can have non-uniform affinity in the absence of controlling techniques and, as such, determining all unique zone combinations, e.g., via combinatorics component 450, for example, according to the formula, $$\frac{(N-m)!/k!}{((N-m)-k)!},$$

can allow for directing distribution of fragments of a protection set among the determined unique zone combinations to ensure balance in the storing of the protection sets. Where a ten-zone geographically diverse data storage system employs a 4+2 EC scheme, there can be 70 unique zone combinations as has been noted elsewhere herein, which can be determined via combinatorics component 450. Accordingly, a first round of protection sets can be iteratively distributed to each of these unique zone combinations before a second protection set can be distributed to an already used protection set in a second iterative round. Similarly, all 70 combinations can be employed in the second round before a protection set of a third round can use again reuse a combination. This can prevent some combinations amassing many protection sets while other combinations amass comparatively fewer protections sets, a condition leading to a storage imbalance.

By employing combination mathematics, e.g., combinatorics, etc., protection sets can be created using all unique zone combinations, this can lead to perfect affinity distribution between all zones of the geographically diverse data storage system. As an example, a zone can determine a complete set of unique zone combinations, e.g., via a combinatorics component 450, etc., and combine replicated data chunks until each unique zone combination stores a protection set. Subsequently, in this example, the zone can issue another complete set of unique k-combinations that can similarly be filled with protection sets, e.g., in a second round, third round, fourth round, etc. This can be distinguished from the first disclosed distribution technique in that the second disclosed distribution technique is mathematically accurate. However, as is noted elsewhere herein, as the count of zones increases, the number of unique combinations can skyrocket and can lead to management of the geographically diverse data storage system becoming unwieldy, or possibly even unmanageable.

It is again noted that the this second disclosed distribution technique can also benefit from safeguards similar to, or the same as, those noted for the first disclosed distribution technique. As such, the use of thresholds/rules related to forcing encoding based on counts of unencoded data chunks, storage space attributes, etc., are also relevant for use with the second disclosed distribution technique.

Figure 5:
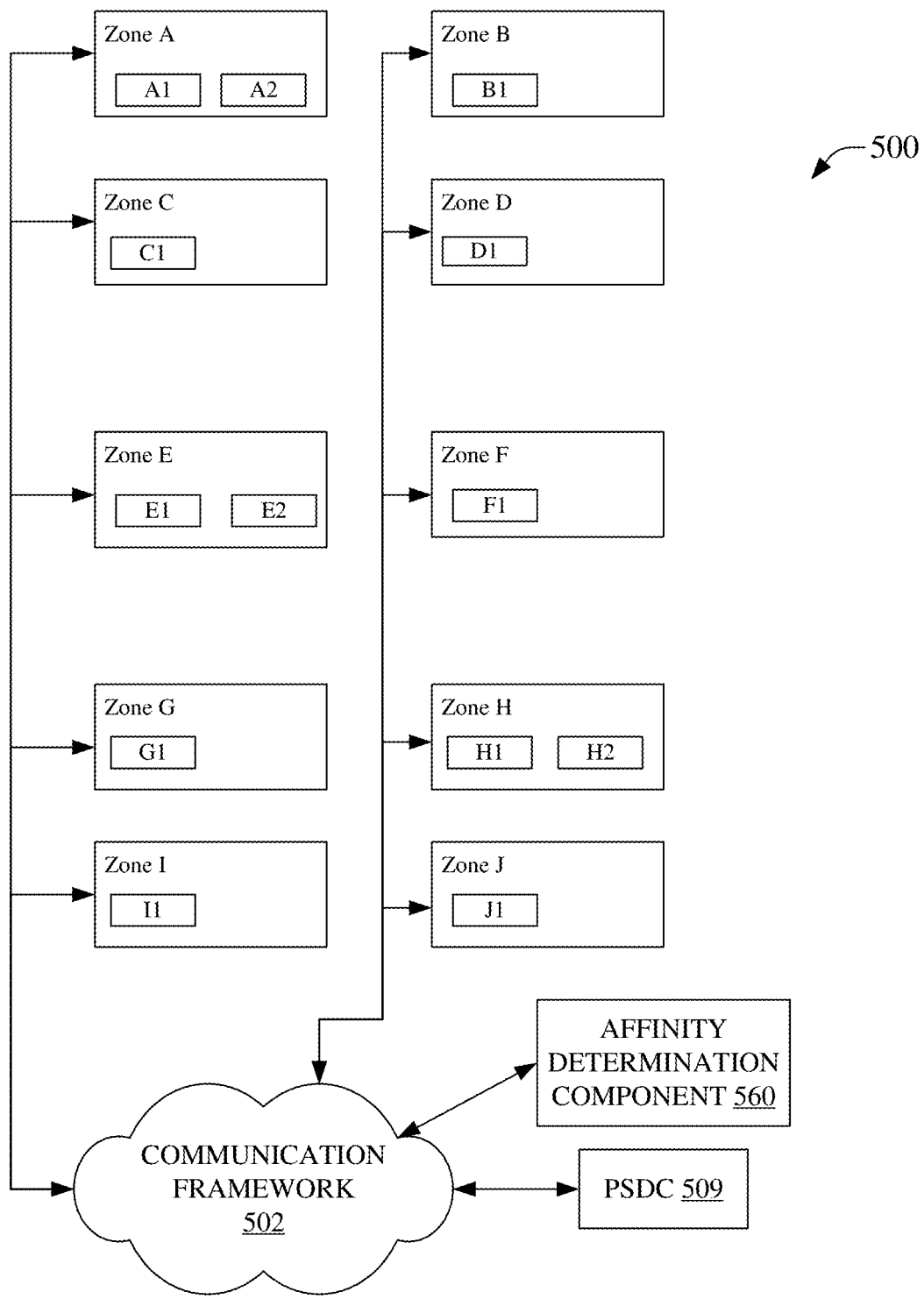
FIG. 5 is an illustration of an example embodiment that can facilitate affinity-based erasure coding in a geographically diverse data storage system, in accordance with aspects of the subject disclosure.

FIG. 5 is illustration of a system 500, which can facilitate affinity-based erasure coding in a geographically diverse data storage system, in accordance with aspects of the subject disclosure. System 500 can comprise a plurality of zones forming a geographically diverse data storage system, for example, system 500 can comprise ten zones, e.g., zones A to J. The zones, e.g., ZSCs, can store data in the form of chunks, e.g., data chunks, coding chunks, replica chunks, etc., e.g., chunks A1 to J1, A2, E2, H2, etc. The zones can communicate via communication framework 502. A geographically diverse data storage system comprised in system 500 can communicate with PSDC 509, which can enable distribution of fragments of protection sets generated according to a selectable erasure coding scheme. Moreover, an affinity matrix can be accessed via affinity determination component 560. An affinity matrix can be an N×N matrix comprising affinity values indicating a level of affinity between two zones, e.g., indicating a number of, count of, etc., protection sets that combine data chunks from both an i"zone and a j" zone. It is noted that that (a) $X_{i,i}=0$ and (b) $X_{i,j}=X_{j,i}$. Accordingly, replicating data chunks can be performed in a manner that strives to keep the affinity values, e.g., all values $X_{i,j}|i!=j$, at a similar value, e.g., less variance between the highest and lowest affinity value of the affinity matrix.

The distribution of fragments/chunks comprising a protection set, as has been previously noted, can support use of erasure coding to reduce consumed storage space while also mitigating a probability of a protection set undergoing a recovery operation via supporting protection sets having total count of fragments/chunks, t, that can be less than a count of zones comprised in the geographically diverse data storage system, N, e.g., a ten-zone geographically diverse data storage system (N=10) employing a 4+2 EC scheme (t=6), etc. Moreover, where a recovery operation does occur in this type of system, the complexity of the recovery operation can be substantially less than can otherwise be encountered, for example, where N=t. It is noted that where less than all zones of a geographically diverse data storage system store a fragment of a protection set, selection of which zones store the fragments can be of some importance to reduce a possibility of the geographically diverse data storage system becoming substantially imbalanced in regard to where data is stored.

Zones can have non-uniform affinity in the absence of controlling techniques and, as such, directing generation of protections sets based on affinity values comprised in the affinity matrix actively affect the uniformity of affinities across a geographically diverse data storage system. For a ten-zone geographically diverse data storage system, an affinity matrix can be a 10×10 matrix, which can be comparable in complexity the 70 unique zone combinations determined in the second disclosed distribution technique. However, for even larger geographically diverse data storage system, for example a 100-zone system, the affinity matrix can be 100×100 in contrast to over 3.5 million unique zone combinations from combinatorics analysis. Accordingly, protection sets can be directed to zones in a manner that maintains, improves, or least perturbs an affinity matrix.

In an embodiment, zones of a geographically diverse data storage system can manage affinity by directing data chunk replicas to a zone for encoding, wherein the selection of the zone is based on rules intended to preferably flatten affinities across the geographically diverse data storage system, alternatively maintain a current affinity flatness, or at least minimize perturbation of the current affinity flatness. In this regard, distribution of fragments of a protection set that improves affinity flatness the most is the highest preference, followed by a distribution that maintains a current flatness, and lowest preference is a distribution that perturbs the flatness, e.g., a lowest perturbation. Whereas an affinity matrix can be a square matrix N×N, where N is a number of zones comprising a geographically diverse data storage system, a value $X_{i,j}$ in the matrix can indicate a number, count, etc., of protection sets that combine data chunks from both the $i^{th}$ zone and the $j^{th}$ zone. It is again noted that $X_{i,i}=0$ and $X_{i,j}=X_{j,i}$. Combining replicated data chunks is then intended to keep all values $X_{i,j}|i!=j$ the same or similar, e.g., minimizing variance between a maximum and minimum affinity value of the affinity matrix.

PSDC 509 can determine data chunks to be combined in a protection set via encoding and can implement logic intended to keep an affinity matrix as flat as possible. A replicated data chunk can remain in a plain, e.g., not encoded, form until PSDC 509 can determine suitable other data chunks from other zone to join when generating a protection set. PSDC 509 can identify a group of zones that can participate in the protection set by providing a replica of a data chunks to be protected, wherein the resulting protection set that would preferably improve the flatness of the affinity matrix, albeit maintaining flatness, minimizing perturbation of the flatness, etc., are also viable where improvement of the flatness is determined to not be practicable or possible. PSDC 509 can direct that generating a protection set is to be delayed until the appropriate data chunks from the other zones are replicated in compliance with the determined effect on the affinity of the system, e.g., if one or more data chunks are missing, PSDC 509 can wait until all such chunks are available before actually creating the identified protection set.

In an embodiment PSDC 509 can identify a group of zones to contribute data chunk replicas to a protection set. PSDC 509 can employ an affinity matrix to find a zone that can have a minimal total affinity with other zones, e.g., the zone can be one that has a minimal sum of $X_{i,j}$ in its row of the affinity matrix. This zone can be the first zone to contribute a data chunk replica to a protection set. PSDC 509 can also determine a second zone that has minimal affinity with the first zone. This second zone can then contribute a data chunk replica to the protection set. PSDC 509 can repeat selections until k zones will contribute to the protection set, e.g., based on a selected EC scheme. PSDC 509 can further identify an additional zone that can have a minimal sum of affinities with the zones that have been identified above, which additional zone can be where the corresponding coding chunk is generated from the replica data chunks. This third disclosed distribution technique is mathematically accurate and, in contrast to the second disclose distribution technique, can have more moderate memory requirements, even where a geographically diverse data storage system becomes very large, e.g., having thousands of zones, etc., as has been previously disclosed herein.

As above, this third disclosed distribution technique can also benefit from safeguards similar to, or the same as, those noted for the first and/or second disclosed distribution technique. As such, the use of thresholds/rules related to forcing encoding based on counts of unencoded data chunks, storage space attributes, etc., are also relevant for use with the second disclosed distribution technique.

Figure 6:
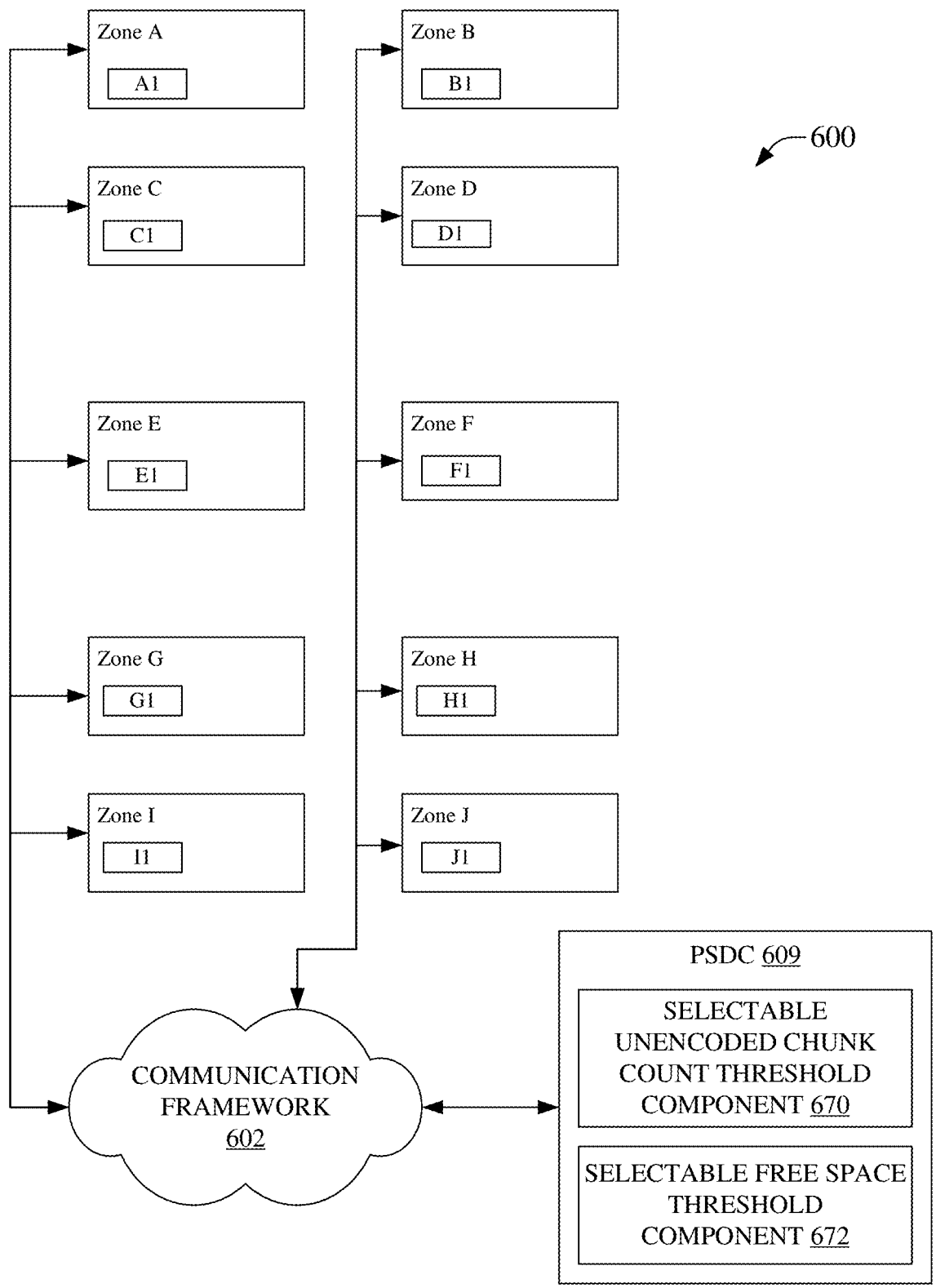
FIG. 6 is an illustration of an example embodiment that can facilitate threshold-triggered erasure coding in a geographically diverse data storage system, in accordance with aspects of the subject disclosure.

FIG. 6 is illustration of a system 600, which can facilitate threshold-triggered erasure coding in a geographically diverse data storage system, in accordance with aspects of the subject disclosure. System 600 can comprise a plurality of zones forming a geographically diverse data storage system, for example, system 600 can comprise ten zones, e.g., zones A to J. The zones, e.g., ZSCs, can store data in the form of chunks, e.g., data chunks, coding chunks, replica chunks, etc., e.g., chunks A1 to J1, etc. The zones can communicate via communication framework 602. A geographically diverse data storage system comprised in system 600 can communicate with PSDC 609, which can enable distribution of fragments of protection sets generated according to a selectable erasure coding scheme. As has been disclosed elsewhere herein, different distribution techniques can be implemented via PSDC 609. In some embodiments, a distribution technique can result in delaying encoding beyond an acceptable level. Accordingly, thresholds, rules, etc., can be implemented to force encoding of a protection set despite application of a distribution technique.

As such, system 600 can comprise selectable unencoded chunk count threshold component 670. A threshold value, or rule, can be specified, for example, for a number of unencoded data chunks that were replicated from a zone or group of zones, for a count of unencoded chunks being stored at a zone, etc. If the threshold value is traversed, data chunks can be caused to be encoded into a protection set. This encoding can be despite any applied distribution technique and can act as a type of safety valve to avoid storing too many unencoded data chunk replicas. Heuristics can be employed to reduce the backlog to another threshold level.

Moreover, system 600 can comprise selectable free space threshold component 672 that can force encoding in response to determining that a threshold level of storage space has been traversed. Selectable free space threshold component 672 can enable selection of a threshold level of space, e.g., free space, or conversely, used space in a zone. Where the threshold level is traversed, encoding can be implemented, despite an employed distribution technique, to improve the amount of space being consumed by unencoded data chunk replicas. As an example, where 10% of total zone capacity remains, forced encoding can be implemented. As above, heuristics can be employed to return free storage space to another threshold level.

Figure 7:
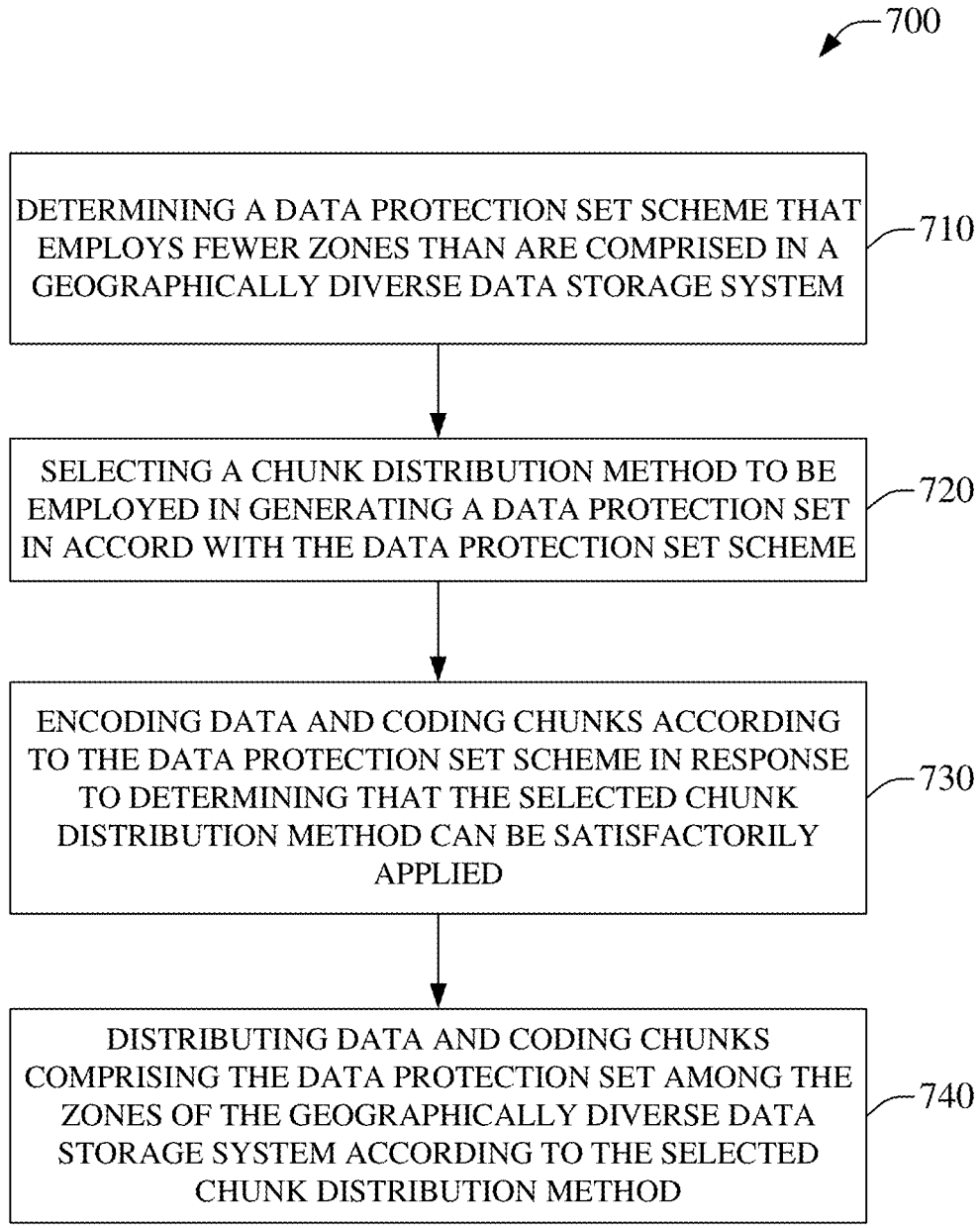
FIG. 7 is an illustration of an example embodiment that can facilitate erasure coding to fewer zones than comprise a geographically diverse data storage system, in accordance with aspects of the subject disclosure.
Figure 8:
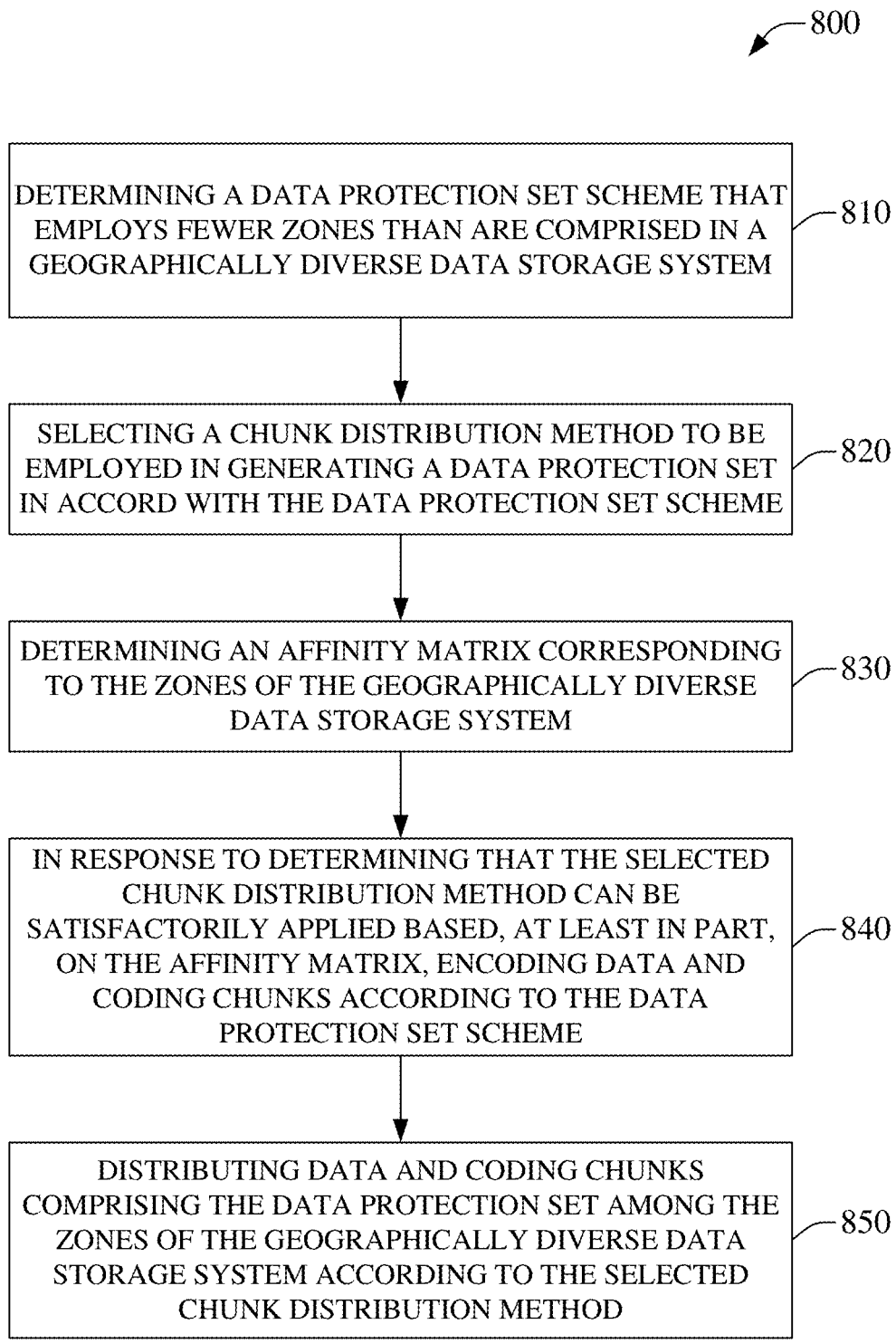
FIG. 8 is an illustration of an example embodiment that can facilitate affinity-based erasure coding in a geographically diverse data storage system, in accordance with aspects of the subject disclosure.

In view of the example system(s) described above, example method(s) that can be implemented in accordance with the disclosed subject matter can be better appreciated with reference to flowcharts in FIG. 7-FIG. 8. For purposes of simplicity of explanation, example methods disclosed herein are presented and described as a series of acts; however, it is to be understood and appreciated that the claimed subject matter is not limited by the order of acts, as some acts may occur in different orders and/or concurrently with other acts from that shown and described herein. For example, one or more example methods disclosed herein could alternatively be represented as a series of interrelated states or events, such as in a state diagram. Moreover, interaction diagram(s) may represent methods in accordance with the disclosed subject matter when disparate entities enact disparate portions of the methods. Furthermore, not all illustrated acts may be required to implement a described example method in accordance with the subject specification. Further yet, two or more of the disclosed example methods can be implemented in combination with each other, to accomplish one or more aspects herein described. It should be further appreciated that the example methods disclosed throughout the subject specification are capable of being stored on an article of manufacture (e.g., a computer-readable medium) to allow transporting and transferring such methods to computers for execution, and thus implementation, by a processor or for storage in a memory.

FIG. 7 is an illustration of an example method 700, facilitating erasure coding to fewer zones than comprise a geographically diverse data storage system, in accordance with aspects of the subject disclosure. At 710, method 700 can comprise determining a data protection set scheme that employs fewer zones than are comprised in a geographically diverse data storage system. In an embodiment, a data protection set can comprise t total fragments/chunks, where t=k+m, e.g., in accord with a selected erasure coding scheme. Where the count of zones is greater than the total chunks of a protection set, e.g., N>t, the protection set can be fully distributed among the zones. As an aside, full distribution is also possible where N=t. Where N >t, not all zones will store a chunk/fragment of the protection set, e.g., in a ten-zone system employing a 4+2 EC scheme, for each protection set stored, there can be four zones that do not store a chunk/fragment of that protection set because the protection set comprises six chunks/fragments and there are ten zones, leaving four zones without a chunk/fragment to store.

At 720, method 700 can comprise selecting a chunk distribution method to be employed in generating a data protection set in accord with the data protection set scheme. A chunk distribution method can facilitate storing fragments of a data protection set, e.g., data chunks and coding chunks, among the available zones. A selected chunk distribution method can therefore impact how the fragments are distributed in the zones of the storage system. Several distribution techniques are disclosed elsewhere herein. It is noted that different benefits and drawbacks can be associated with the different presented techniques. As an example, a first technique can be comparatively simple and inexpensive to implement but can be associated with poor distribution control. Another technique can provide for better distribution control, e.g., flatter affinity between zones, but can become difficult to manage for very large numbers of zones. Yet another technique can provide good distribution control and can remain manageable even for large counts of zones, but can be more complicated to implement, e.g., an affinity matrix can be generated and kept up to date to enable proper selection of zones that are appropriate for a next protection set, etc.

Method 700, at 730, can comprise encoding data and coding chunks according to the data protection set scheme in response to determining that the selected chunk distribution method can be satisfactorily applied. Chunks of a data protection set can be encoded in accord with the data protection set scheme and in accord with the selected distribution method. As an example, in a ten-zone storage system, a selected distribution method can indicate that there can be 70 unique zone combinations for a 4+2 EC scheme. Accordingly, an eligible unique zone combination can be accorded a protection set, then can then be removed from the eligible zones. After all of the 70 zones have been accorded a protection set, the 70 unique zones can again all be made eligible for another round of generating protection sets.

At 740, method 700 can comprise distributing data and coding chunks comprising the data protection set among the zones of the geographically diverse data storage system according to the selected chunk distribution method. At this point method 700 can end. The generated protection set can be distributed after each iteration of encoding. In an embodiment, for example in system 300, replicas od data chunks A1-D1 can be employed to generate E1 and F2 at zone E, then coding chunk F2 can be moved to zone F. Similarly, in system 300, replicas of data chunks G1 to J1 can be employed to generate coding chunks F1 and E2 at zone F, whereafter E2 can be moved to zone E. Thereafter the replicas of A1 to D1 and G1 to J1 can be discarded, deleted, overwritten, etc., because the information represented in A1 to D1 is protected via E1 and F1 and the information represented in G1 to J1 is protected via E2 and F2.

FIG. 8 is an illustration of an example method 800, facilitating affinity-based erasure coding in a geographically diverse data storage system, in accordance with aspects of the subject disclosure. At 810, method 800 can comprise determining a data protection set scheme that employs fewer zones than are comprised in a geographically diverse data storage system. In an embodiment, a data protection set can comprise t total fragments/chunks, where t=k+m, e.g., in accord with a selected erasure coding scheme. Where the count of zones is greater than the total chunks of a protection set, e.g., N>t, the protection set can be fully distributed among the zones. As an aside, full distribution is also possible where N=t. Where N >t, not all zones will store a chunk/fragment of the protection set, e.g., in a ten-zone system employing a 4+2 EC scheme, for each protection set stored, there can be four zones that do not store a chunk/fragment of that protection set because the protection set comprises six chunks/fragments and there are ten zones, leaving four zones without a chunk/fragment to store.

At 820, method 800 can comprise selecting a chunk distribution method to be employed in generating a data protection set in accord with the data protection set scheme. A chunk distribution method can facilitate storing fragments of a data protection set, e.g., data chunks and coding chunks, among the available zones. A selected chunk distribution method can therefore impact how the fragments are distributed in the zones of the storage system. Several distribution techniques are disclosed elsewhere herein. It is noted that different benefits and drawbacks can be associated with the different presented techniques. As an example, a first technique can be comparatively simple and inexpensive to implement but can be associated with poor distribution control. Another technique can provide for better distribution control, e.g., flatter affinity between zones, but can become difficult to manage for very large numbers of zones. Yet another technique can provide good distribution control and can remain manageable even for large counts of zones, but can be more complicated to implement, e.g., an affinity matrix can be generated and kept up to date to enable proper selection of zones that are appropriate for a next protection set, etc.

At 830, method 800 can comprise determining an affinity matrix. The affinity matrix can correspond to the zones of the geographically diverse data storage system. An affinity matrix, as is noted elsewhere herein, can be a square matrix that is N×N, where N is the number of zones. A value, $X_{i,j}$, in an affinity matrix can indicate a number of, count of, etc., protection sets that combine data chunks from both an $i^{th}$ zone and a $j^{th}$ zone. Note that (a) $X_{i,i}=0$ and (b) $X_{i,j}=X_{j,i}$. Accordingly, replicating data chunks can be performed in a manner that strives to keep the affinity values, e.g., all values $X_{i,j}, i!=j$, at a similar value, e.g., less variance between the highest and lowest affinity value of the affinity matrix.

Method 800, at 840, can comprise encoding data and coding chunks according to the data protection set scheme in response to determining that the selected chunk distribution method can be satisfactorily applied. The encoding can be in response to determining that the selected chunk distribution method can be satisfactorily applied. This determination can be based, at least in part, on the affinity matrix. Chunks of a data protection set can be encoded in accord with the data protection set scheme. The affinity matrix can facilitate the determining that the chunks can be satisfactorily distributed, e.g., where satisfaction can correspond to improving, maintaining, or least perturbing the affinity between zones of the geographically diverse data storage system, as is disclosed elsewhere herein. As an example, determining that a protection set will cause flatter affinity across the zones of the geographically diverse data storage system can be determines to be satisfactory and, in response, corresponding encoding can be undertaken.

At 850, method 800 can comprise distributing data and coding chunks comprising the data protection set among the zones of the geographically diverse data storage system according to the selected chunk distribution method. At this point method 800 can end.

Figure 9:
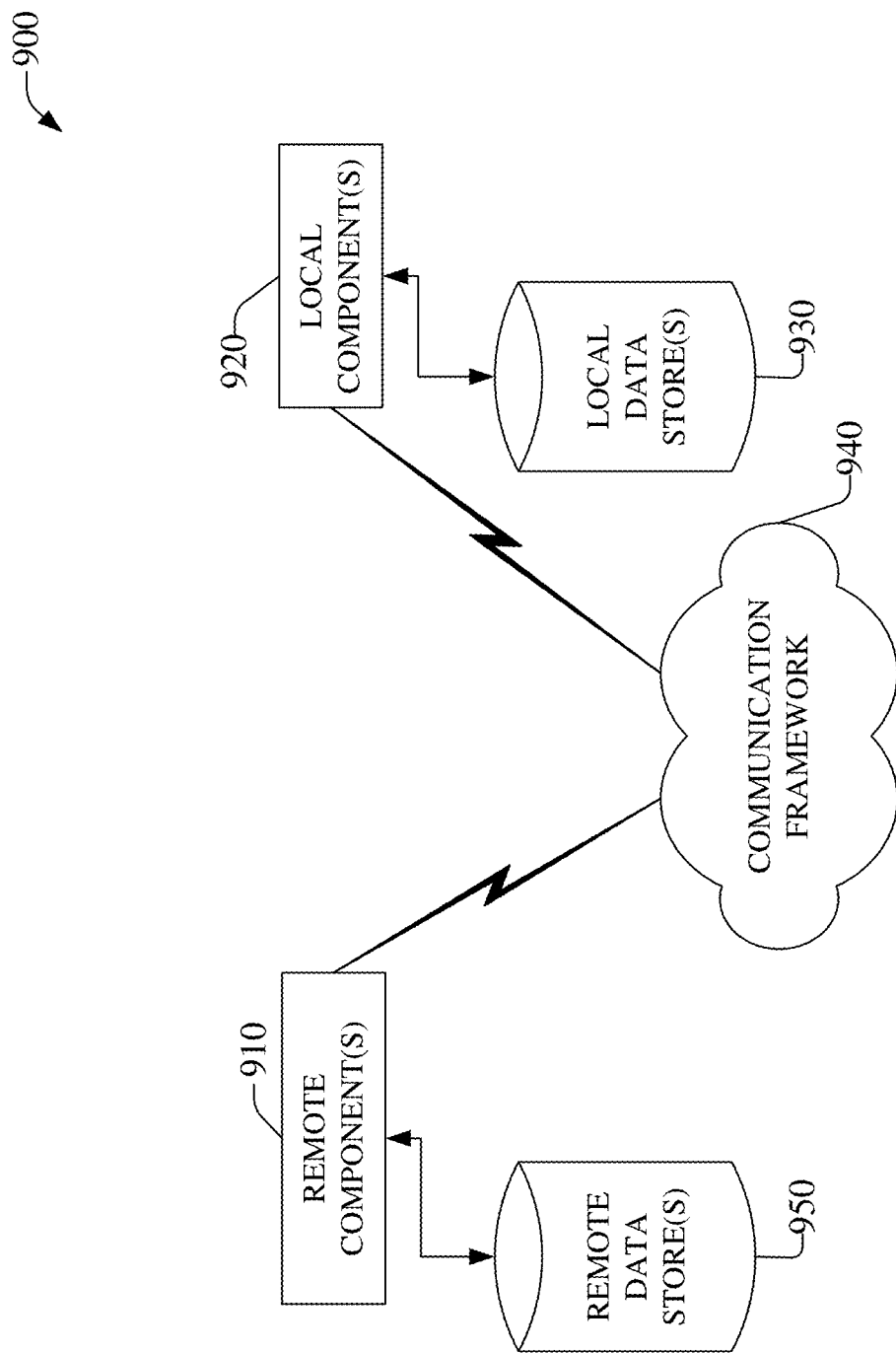
FIG. 9 depicts an example schematic block diagram of a computing environment with which the disclosed subject matter can interact.

FIG. 9 is a schematic block diagram of a computing environment 900 with which the disclosed subject matter can interact. The system 900 comprises one or more remote component(s) 910. The remote component(s) 910 can be hardware and/or software (e.g., threads, processes, computing devices). In some embodiments, remote component(s) 910 can be a remotely located ZSC, etc., remotely located ECCC 108, etc., remotely located PSDC 109-409, etc., affinity determination component 560, etc., or other remotely located device connected to a local device, e.g., connected to a local ZSC, etc., via communication framework, e.g., communication framework 102-602, 940, etc. Communication framework 940 can comprise wired network devices, wireless network devices, mobile devices, wearable devices, radio access network devices, gateway devices, femtocell devices, servers, etc. In an aspect the remotely located ZSC can be embodied in ZSC 110, 120, 130, Zones A-F of system 200, 202, etc., Zones A-J of system 300-600, etc., or other ZSC disclosed herein.

The system 900 also comprises one or more local component(s) 920. The local component(s) 920 can be hardware and/or software (e.g., threads, processes, computing devices). In some embodiments, local component(s) 920 can comprise a local ZSC connected to a remote ZSC via communication framework 102, 202, 940, etc.

One possible communication between a remote component(s) 910 and a local component(s) 920 can be in the form of a data packet adapted to be transmitted between two or more computer processes. Another possible communication between a remote component(s) 910 and a local component(s) 920 can be in the form of circuit-switched data adapted to be transmitted between two or more computer processes in radio time slots. The system 900 comprises a communication framework 940 that can be employed to facilitate communications between the remote component(s) 910 and the local component(s) 920, and can comprise an air interface, e.g., Uu interface of a UMTS network, via a long-term evolution (LTE) network, etc. Remote component(s) 910 can be operably connected to one or more remote data store(s) 950, such as a hard drive, solid state drive, SIM card, device memory, etc., that can be employed to store information on the remote component(s) 910 side of communication framework 940. Similarly, local component(s) 920 can be operably connected to one or more local data store(s) 930, that can be employed to store information on the local component(s) 920 side of communication framework 940. As an example, information corresponding to chunks based on ZSCs can be communicated via communication framework 940 to other ZSCs of a storage network, e.g., to facilitate recovering segments protected by an erasure coding scheme, etc., as disclosed herein.

Figure 10:
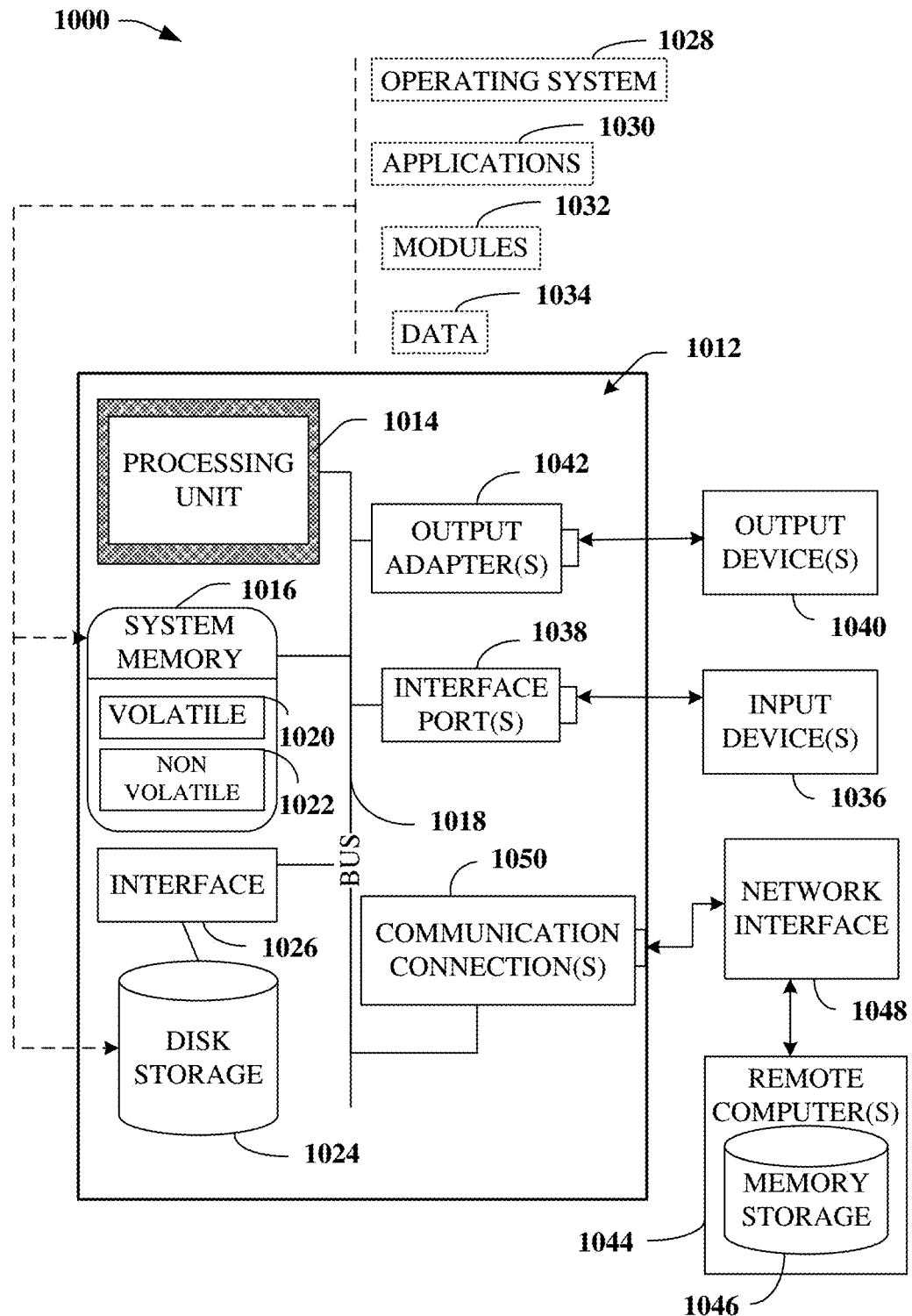
FIG. 10 illustrates an example block diagram of a computing system operable to execute the disclosed systems and methods in accordance with an embodiment.

In order to provide a context for the various aspects of the disclosed subject matter, FIG. 10, and the following discussion, are intended to provide a brief, general description of a suitable environment in which the various aspects of the disclosed subject matter can be implemented. While the subject matter has been described above in the general context of computer-executable instructions of a computer program that runs on a computer and/or computers, those skilled in the art will recognize that the disclosed subject matter also can be implemented in combination with other program modules. Generally, program modules comprise routines, programs, components, data structures, etc. that performs particular tasks and/or implement particular abstract data types.

In the subject specification, terms such as "store," "storage," "data store," data storage," "database," and substantially any other information storage component relevant to operation and functionality of a component, refer to "memory components," or entities embodied in a "memory" or components comprising the memory. It is noted that the memory components described herein can be either volatile memory or nonvolatile memory, or can comprise both volatile and nonvolatile memory, by way of illustration, and not limitation, volatile memory 1020 (see below), nonvolatile memory 1022 (see below), disk storage 1024 (see below), and memory storage 1046 (see below). Further, nonvolatile memory can be included in read only memory, programmable read only memory, electrically programmable read only memory, electrically erasable read only memory, or flash memory. Volatile memory can comprise random access memory, which acts as external cache memory. By way of illustration and not limitation, random access memory is available in many forms such as synchronous random access memory, dynamic random access memory, synchronous dynamic random access memory, double data rate synchronous dynamic random access memory, enhanced synchronous dynamic random access memory, SynchLink dynamic random access memory, and direct Rambus random access memory. Additionally, the disclosed memory components of systems or methods herein are intended to comprise, without being limited to comprising, these and any other suitable types of memory.

Moreover, it is noted that the disclosed subject matter can be practiced with other computer system configurations, comprising single-processor or multiprocessor computer systems, mini-computing devices, mainframe computers, as well as personal computers, hand-held computing devices (e.g., personal digital assistant, phone, watch, tablet computers, netbook computers, . . . ), microprocessor-based or programmable consumer or industrial electronics, and the like. The illustrated aspects can also be practiced in distributed computing environments where tasks are performed by remote processing devices that are linked through a communications network; however, some if not all aspects of the subject disclosure can be practiced on stand-alone computers. In a distributed computing environment, program modules can be located in both local and remote memory storage devices.

FIG. 10 illustrates a block diagram of a computing system 1000 operable to execute the disclosed systems and methods in accordance with an embodiment. Computer 1012, which can be, for example, comprised in ZSC 110, 120, 130, etc., ECCC 108, etc., PSDC 109-409, etc., affinity determination component 560, etc., Zones A-F of system 200, 202, etc., Zones A-J of system 300-600, etc., or in other components disclosed herein, can comprise a processing unit 1014, a system memory 1016, and a system bus 1018. System bus 1018 couples system components comprising, but not limited to, system memory 1016 to processing unit 1014. Processing unit 1014 can be any of various available processors. Dual microprocessors and other multiprocessor architectures also can be employed as processing unit 1014.

System bus 1018 can be any of several types of bus structure(s) comprising a memory bus or a memory controller, a peripheral bus or an external bus, and/or a local bus using any variety of available bus architectures comprising, but not limited to, industrial standard architecture, microchannel architecture, extended industrial standard architecture, intelligent drive electronics, video electronics standards association local bus, peripheral component interconnect, card bus, universal serial bus, advanced graphics port, personal computer memory card international association bus, Firewire (Institute of Electrical and Electronics Engineers 1194), and small computer systems interface.

System memory 1016 can comprise volatile memory 1020 and nonvolatile memory 1022. A basic input/output system, containing routines to transfer information between elements within computer 1012, such as during start-up, can be stored in nonvolatile memory 1022. By way of illustration, and not limitation, nonvolatile memory 1022 can comprise read only memory, programmable read only memory, electrically programmable read only memory, electrically erasable read only memory, or flash memory. Volatile memory 1020 comprises read only memory, which acts as external cache memory. By way of illustration and not limitation, read only memory is available in many forms such as synchronous random access memory, dynamic read only memory, synchronous dynamic read only memory, double data rate synchronous dynamic read only memory, enhanced synchronous dynamic read only memory, SynchLink dynamic read only memory, Rambus direct read only memory, direct Rambus dynamic read only memory, and Rambus dynamic read only memory.

Computer 1012 can also comprise removable/non-removable, volatile/non-volatile computer storage media. FIG. 10 illustrates, for example, disk storage 1024. Disk storage 1024 comprises, but is not limited to, devices like a magnetic disk drive, floppy disk drive, tape drive, flash memory card, or memory stick. In addition, disk storage 1024 can comprise storage media separately or in combination with other storage media comprising, but not limited to, an optical disk drive such as a compact disk read only memory device, compact disk recordable drive, compact disk rewritable drive or a digital versatile disk read only memory. To facilitate connection of the disk storage devices 1024 to system bus 1018, a removable or non-removable interface is typically used, such as interface 1026.

Computing devices typically comprise a variety of media, which can comprise computer-readable storage media or communications media, which two terms are used herein differently from one another as follows.

Computer-readable storage media can be any available storage media that can be accessed by the computer and comprises both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can comprise, but are not limited to, read only memory, programmable read only memory, electrically programmable read only memory, electrically erasable read only memory, flash memory or other memory technology, compact disk read only memory, digital versatile disk or other optical disk storage, magnetic cassettes, magnetic tape, magnetic disk storage or other magnetic storage devices, or other tangible media which can be used to store desired information. In this regard, the term "tangible" herein as may be applied to storage, memory or computer-readable media, is to be understood to exclude only propagating intangible signals per se as a modifier and does not relinquish coverage of all standard storage, memory or computer-readable media that are not only propagating intangible signals per se. In an aspect, tangible media can comprise non-transitory media wherein the term "non-transitory" herein as may be applied to storage, memory or computer-readable media, is to be understood to exclude only propagating transitory signals per se as a modifier and does not relinquish coverage of all standard storage, memory or computer-readable media that are not only propagating transitory signals per se. Computer-readable storage media can be accessed by one or more local or remote computing devices, e.g., via access requests, queries or other data retrieval protocols, for a variety of operations with respect to the information stored by the medium. As such, for example, a computer-readable medium can comprise executable instructions stored thereon that, in response to execution, can cause a system comprising a processor to perform operations, comprising determining permission to generate a protection set. The permission can be based on a fragment distribution scheme being determined to be satisfied by predicted fragments of the protection set, wherein the protection set is to be generated in a geographically diverse data storage system. Generating the protection set can be enabled based on the permission. The generating the protection set can comprise encoding a coding fragment based on replicated data fragments, wherein the replicated data fragments are replicated at a zone of the geographically diverse data storage system.

Communications media typically embody computer-readable instructions, data structures, program modules or other structured or unstructured data in a data signal such as a modulated data signal, e.g., a carrier wave or other transport mechanism, and comprises any information delivery or transport media. The term "modulated data signal" or signals refers to a signal that has one or more of its characteristics set or changed in such a manner as to encode information in one or more signals. By way of example, and not limitation, communication media comprise wired media, such as a wired network or direct-wired connection, and wireless media such as acoustic, RF, infrared and other wireless media.

It can be noted that FIG. 10 describes software that acts as an intermediary between users and computer resources described in suitable operating environment 1000. Such software comprises an operating system 1028. Operating system 1028, which can be stored on disk storage 1024, acts to control and allocate resources of computer system 1012. System applications 1030 take advantage of the management of resources by operating system 1028 through program modules 1032 and program data 1034 stored either in system memory 1016 or on disk storage 1024. It is to be noted that the disclosed subject matter can be implemented with various operating systems or combinations of operating systems.

A user can enter commands or information into computer 1012 through input device(s) 1036. In some embodiments, a user interface can allow entry of user preference information, etc., and can be embodied in a touch sensitive display panel, a mouse/pointer input to a graphical user interface (GUI), a command line controlled interface, etc., allowing a user to interact with computer 1012. Input devices 1036 comprise, but are not limited to, a pointing device such as a mouse, trackball, stylus, touch pad, keyboard, microphone, joystick, game pad, satellite dish, scanner, TV tuner card, digital camera, digital video camera, web camera, cell phone, smartphone, tablet computer, etc. These and other input devices connect to processing unit 1014 through system bus 1018 by way of interface port(s) 1038. Interface port(s) 1038 comprise, for example, a serial port, a parallel port, a game port, a universal serial bus, an infrared port, a Bluetooth port, an IP port, or a logical port associated with a wireless service, etc. Output device(s) 1040 use some of the same type of ports as input device(s) 1036.

Thus, for example, a universal serial busport can be used to provide input to computer 1012 and to output information from computer 1012 to an output device 1040. Output adapter 1042 is provided to illustrate that there are some output devices 1040 like monitors, speakers, and printers, among other output devices 1040, which use special adapters. Output adapters 1042 comprise, by way of illustration and not limitation, video and sound cards that provide means of connection between output device 1040 and system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. Remote computer(s) 1044 can be a personal computer, a server, a router, a network PC, cloud storage, a cloud service, code executing in a cloud-computing environment, a workstation, a microprocessor-based appliance, a peer device, or other common network node and the like, and typically comprises many or all of the elements described relative to computer 1012. A cloud computing environment, the cloud, or other similar terms can refer to computing that can share processing resources and data to one or more computer and/or other device(s) on an as needed basis to enable access to a shared pool of configurable computing resources that can be provisioned and released readily. Cloud computing and storage solutions can store and/or process data in third-party data centers which can leverage an economy of scale and can view accessing computing resources via a cloud service in a manner similar to a subscribing to an electric utility to access electrical energy, a telephone utility to access telephonic services, etc.

For purposes of brevity, only a memory storage device 1046 is illustrated with remote computer(s) 1044. Remote computer(s) 1044 is logically connected to computer 1012 through a network interface 1048 and then physically connected by way of communication connection 1050. Network interface 1048 encompasses wire and/or wireless communication networks such as local area networks and wide area networks. Local area network technologies comprise fiber distributed data interface, copper distributed data interface, Ethernet, Token Ring and the like. Wide area network technologies comprise, but are not limited to, point-to-point links, circuit-switching networks like integrated services digital networks and variations thereon, packet switching networks, and digital subscriber lines. As noted below, wireless technologies may be used in addition to or in place of the foregoing.

Communication connection(s) 1050 refer(s) to hardware/software employed to connect network interface 1048 to bus 1018. While communication connection 1050 is shown for illustrative clarity inside computer 1012, it can also be external to computer 1012. The hardware/software for connection to network interface 1048 can comprise, for example, internal and external technologies such as modems, comprising regular telephone grade modems, cable modems and digital subscriber line modems, integrated services digital network adapters, and Ethernet cards.

The above description of illustrated embodiments of the subject disclosure, comprising what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit, a digital signal processor, a field programmable gate array, a programmable logic controller, a complex programmable logic device, a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor may also be implemented as a combination of computing processing units.

As used in this application, the terms "component," "system," "platform," "layer," "selector," "interface," and the like are intended to refer to a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, a program, and/or a computer. By way of illustration and not limitation, both an application running on a server and the server can be a component. One or more components may reside within a process and/or thread of execution and a component may be localized on one computer and/or distributed between two or more computers. In addition, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or a firmware application executed by a processor, wherein the processor can be internal or external to the apparatus and executes at least a part of the software or firmware application. As yet another example, a component can be an apparatus that provides specific functionality through electronic components without mechanical parts, the electronic components can comprise a processor therein to execute software or firmware that confers at least in part the functionality of the electronic components.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. Moreover, the use of any particular embodiment or example in the present disclosure should not be treated as exclusive of any other particular embodiment or example, unless expressly indicated as such, e.g., a first embodiment that has aspect A and a second embodiment that has aspect B does not preclude a third embodiment that has aspect A and aspect B. The use of granular examples and embodiments is intended to simplify understanding of certain features, aspects, etc., of the disclosed subject matter and is not intended to limit the disclosure to said granular instances of the disclosed subject matter or to illustrate that combinations of embodiments of the disclosed subject matter were not contemplated at the time of actual or constructive reduction to practice.

Further, the term "include" is intended to be employed as an open or inclusive term, rather than a closed or exclusive term. The term "include" can be substituted with the term "comprising" and is to be treated with similar scope, unless otherwise explicitly used otherwise. As an example, "a basket of fruit including an apple" is to be treated with the same breadth of scope as, "a basket of fruit comprising an apple."

Furthermore, the terms "user," "subscriber," "customer," "consumer," "prosumer," "agent," and the like are employed interchangeably throughout the subject specification, unless context warrants particular distinction(s) among the terms. It should be appreciated that such terms can refer to human entities, machine learning components, or automated components (e.g., supported through artificial intelligence, as through a capacity to make inferences based on complex mathematical formalisms), that can provide simulated vision, sound recognition and so forth.

Aspects, features, or advantages of the subject matter can be exploited in substantially any, or any, wired, broadcast, wireless telecommunication, radio technology or network, or combinations thereof. Non-limiting examples of such technologies or networks comprise broadcast technologies (e.g., sub-Hertz, extremely low frequency, very low frequency, low frequency, medium frequency, high frequency, very high frequency, ultra-high frequency, super-high frequency, extremely high frequency, terahertz broadcasts, etc.); Ethernet; X.25; powerline-type networking, e.g., Powerline audio video Ethernet, etc.; femtocell technology; Wi-Fi; worldwide interoperability for microwave access; enhanced general packet radio service; second generation partnership project (2G or 2GPP); third generation partnership project (3G or 3GPP); fourth generation partnership project (4G or 4GPP); long term evolution (LTE); fifth generation partnership project (5G or 5GPP); third generation partnership project universal mobile telecommunications system; third generation partnership project 2; ultra mobile broadband; high speed packet access; high speed downlink packet access; high speed uplink packet access; enhanced data rates for global system for mobile communication evolution radio access network; universal mobile telecommunications system terrestrial radio access network; or long term evolution advanced. As an example, a millimeter wave broadcast technology can employ electromagnetic waves in the frequency spectrum from about 30 GHz to about 300 GHz. These millimeter waves can be generally situated between microwaves (from about 1 GHz to about 30 GHz) and infrared (IR) waves, and are sometimes referred to extremely high frequency (EHF). The wavelength (k) for millimeter waves is typically in the 1-mm to 10-mm range.

The term "infer" or "inference" can generally refer to the process of reasoning about, or inferring states of, the system, environment, user, and/or intent from a set of observations as captured via events and/or data. Captured data and events can include user data, device data, environment data, data from sensors, sensor data, application data, implicit data, explicit data, etc. Inference, for example, can be employed to identify a specific context or action, or can generate a probability distribution over states of interest based on a consideration of data and events. Inference can also refer to techniques employed for composing higher-level events from a set of events and/or data. Such inference results in the construction of new events or actions from a set of observed events and/or stored event data, whether the events, in some instances, can be correlated in close temporal proximity, and whether the events and data come from one or several event and data sources. Various classification schemes and/or systems (e.g., support vector machines, neural networks, expert systems, Bayesian belief networks, fuzzy logic, and data fusion engines) can be employed in connection with performing automatic and/or inferred action in connection with the disclosed subject matter.

What has been described above includes examples of systems and methods illustrative of the disclosed subject matter. It is, of course, not possible to describe every combination of components or methods herein. One of ordinary skill in the art may recognize that many further combinations and permutations of the claimed subject matter are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

What is claimed is:

1. A system, comprising:
   a processor; and
   a memory that stores executable instructions that, when executed by the processor, facilitate performance of operations, comprising:
     determining an erasure coding process to be employed in encoding data stored in a geographically diverse data storage system comprising a first number of zones, wherein generating a protection set by employing the erasure coding process results in a second number of data fragments and a third number of coding fragments, and wherein the protection set comprises a fourth number of total fragments comprising the second number of data fragments and the third number of coding fragments;
     determine a protection set distribution process based on the erasure coding process and the first number; and
     in response to determining that the second number of data fragments is in accord with the protection set distribution process, granting permission to encode the third number of coding fragments in accord with the protection set distribution process.

2. The system of claim 1, wherein the first number is greater than, or equal to, a sum of the second and the third number.

3. The system of claim 2, wherein, after generating the protection set, a result is that no zone of the geographically diverse data storage system stores more than one of the fourth number of total fragments of the protection set.

4. The system of claim 1, wherein the first number is less than a sum of the second number and the third number, and wherein, after generating the protection set, a result is that a zone of the geographically diverse data storage system stores more than one of the fourth number of total fragments of the protection set.

5. The system of claim 1, wherein each data fragment of the second number of data fragments is a data chunk that is of a designated storage size, and wherein each coding fragment of the third number of coding fragments is a coding chunk of the designated storage size.

6. The system of claim 1, wherein the protection set distribution process indicates that permission to encode the third number of coding fragments is to be granted for the second number of data fragments in response to at least one data fragment from each of the first number of zones being determined to be available for inclusion in the protection set.

7. The system of claim 1, wherein the protection set distribution process indicates that permission to encode the third number of coding fragments is to be granted in response to the second number of data fragments from the second number of zones of the first number of zones being determined to be available for inclusion in the protection set, and wherein the second number of zones is determined to be a unique zone combination.

8. The system of claim 7, wherein the unique zone combination is one of a determined count of unique zone combinations, wherein the count is a function of $$\frac{(N-m)!/k!}{((N-m)-k)!},$$

wherein the first number is represented as N, wherein the second number is represented as m, and wherein the third number is represented as k.

9. The system of claim 7, wherein the protection set is a first protection set, and wherein the unique zone combination is not employed for storage of a fragment of a second protection set prior to all other unique zone combinations, other than the unique zone combination, having been used for storing fragments of other protection sets, other than the first and second protection set.

10. The system of claim 1, wherein the protection set distribution process indicates that permission to encode the third number of coding fragments is to be granted based on an affinity rule being determined to be satisfied based on an affinity matrix for the geographically diverse data storage system.

11. The system of claim 10, wherein the first number is represented as N, wherein i and j are integer values, wherein the affinity matrix is an N×N matrix of affinity values, and wherein affinity value, $X_{i,j}$, in the affinity matrix indicates a count of protection sets that combine data chunks from both an i"zone and a j" zone of the N zones of the geographically diverse data storage system.

12. The system of claim 10, wherein the affinity rule is determined to be satisfied after the affinity values of the affinity matrix are predicted to be flattened as a result of encoding the third number of coding fragments in accord with the protection set distribution process.

13. The system of claim 10, wherein the affinity rule is determined to be satisfied after the affinity values of the affinity matrix are predicted to be maintained as a result of encoding the third number of coding fragments in accord with the protection set distribution process.

14. The system of claim 10, wherein the affinity rule is determined to be satisfied after the affinity values of the affinity matrix are predicted to be perturbed less, as a result of encoding the third number of coding fragments in accord with the protection set distribution process, than another perturbation resulting from an alternate encoding of the third number of coding fragments.

15. A method, comprising:
   obtaining, by a system comprising a processor, permission to generate a protection set, wherein the permission is based on a fragment distribution rule being determined to be satisfied for a geographically diverse data storage system; and
   enabling, by the system based on the permission, generating the protection set, wherein the generating the protection set comprises encoding a coding fragment based on replicated data fragments, wherein the replicated data fragments are replicated at a zone of the geographically diverse data storage system, and wherein the zone is determined based on an affinity matrix of affinity values between zones of the geographically diverse data storage system.

16. The method of claim 15, further comprising:
   initiating, by the system, generation of the protection set in response to determining that a first threshold value has been transitioned, wherein the first threshold value corresponds to a count of replicated unencoded data fragments being stored; or
   initiating, by the system, the generation of the protection set in response to determining that a second threshold value has been transitioned, wherein the second threshold value corresponds to an amount of free storage space remaining in a portion of the geographically diverse data storage system.

17. A non-transitory machine-readable medium, comprising executable instructions that, when executed by a processor, facilitate performance of operations, comprising:
   determining permission has been granted to generate a protection set, wherein the permission is based on a fragment distribution process being determined to be satisfied by predicted fragments of the protection set, and wherein the protection set is to be generated in a geographically diverse data storage system; and
   enabling generating the protection set, wherein the generating the protection set comprises encoding a coding fragment based on replicated data fragments, and wherein the replicated data fragments are replicated at a zone of the geographically diverse data storage system.

18. The non-transitory machine-readable medium of claim 17, wherein the zone of geographically diverse data storage system is determined based on an affinity matrix of affinity values between zones of the geographically diverse data storage system.

19. The non-transitory machine-readable medium of claim 17, wherein the number of zones of the geographically diverse data storage system is greater than the number of predicted fragments of the protection set.

20. The non-transitory machine-readable medium of claim 17, wherein generation of the protection set is forced to occur, regardless of the permission, in response to determining that a threshold value of a group of threshold values comprising a first threshold value and a second threshold value has been transitioned, wherein the first threshold value corresponds to a count of replicated unencoded data fragments being stored, and wherein the second threshold value corresponds to an amount of free storage space remaining in a portion of the geographically diverse data storage system.

* * * * *